(12) United States Patent
Parker

(10) Patent No.: US 7,791,954 B2
(45) Date of Patent: Sep. 7, 2010

(54) DYNAMIC ERASE STATE IN FLASH DEVICE

(75) Inventor: Allan Parker, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 162 days.

(21) Appl. No.: 12/234,736

(22) Filed: Sep. 22, 2008

(65) Prior Publication Data

US 2010/0074006 A1    Mar. 25, 2010

(51) Int. Cl.
*G11C 16/04* (2006.01)
(52) U.S. Cl. ............... 365/185.29; 365/185.33; 365/218; 365/230.06
(58) Field of Classification Search ........... 365/185.29, 365/185.33, 218, 230.06
See application file for complete search history.

(56) References Cited

U.S. PATENT DOCUMENTS 5,132,935 A * 7/1992 Ashmore, Jr. .......... 365/185.19
2005/0276120 A1 12/2005 Hsia et al.
2007/0247924 A1 10/2007 Zheng et al.
2008/0025089 A1 1/2008 Scheuerlein et al.
2008/0080238 A1 4/2008 Yuda
2008/0151644 A1 6/2008 Park et al.

\* cited by examiner

*Primary Examiner*—Thong Q Le
(74) *Attorney, Agent, or Firm*—Turocy & Watson, LLP

(57) ABSTRACT

Flash memory systems and methodologies are provided herein for facilitating a single logical cell erasure and dynamic erase state. The single logical cell erasure can be accomplished on a basis of a single program and erase entity which is a combination of neighboring drain/source regions of two adjacent physical memory cells. The dynamic erase state can involve an indicator bit that indicates an erase direction of a low voltage state or a high voltage state. The single logical cell erasure can be performed by changing a voltage state of a single program and erase entity according to the indicated erase direction. By employing the indicator bit with the single program and erase entity decoding scheme, the methods and systems can reduce erase time and/or a number of cycles, thereby increasing system reliability, efficiency, and/or durability.

20 Claims, 35 Drawing Sheets

High Voltage State

Type 1  Type 2

Low Voltage State

← 1900

| Vt Level | Q1 | State |
|---|---|---|
| 2 | 0 | Program |
| 1 | 1 | Erase |

| Vt Level | Q1 | State |
|---|---|---|
| 2 | 0 | Erase |
| 1 | 1 | Program |

| Level | Q1 | Erase Indicator | State | Erase Indicator | State |
|---|---|---|---|---|---|
| 2 | 0 | 1 | Program | 0 | Erase |
| 1 | 1 | | Erase | | Program |

DYNAMIC ERASE STATE IN FLASH DEVICE

TECHNICAL FIELD

The following description relates generally to methods and systems for operating a flash device using a dynamic erase state.

BACKGROUND

Electronic devices with the ability to store information (electronic devices) are an important part of society. Electronic devices influence almost every aspect of life, ranging from business transactions to interpersonal communications. Examples of electronic devices include cellular telephones, personal digital assistants, and personal computers. One important aspect of electronic devices is the ability to store information in digital memory. Digital memory can be provided, for example, by a flash device. Flash memory has the advantages of being readable, rewritable, and non-volatile (i.e., flash memory can retain information without a draw from a constant source of power). Additionally, a flash memory device is relatively inexpensive to mass-produce, malting it a desirable choice for personal applications such as storing digital photographs and storing digital music files. Moreover, flash devices generally have an expected lifespan of about one million programming cycles.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

Conventional flash devices are typically erased in units of memory cells called sectors or blocks instead of being erased at a logical cell level, wherein all bits in a given sector or block are switched to a predetermined polarity (e.g., low voltage state or low VT state) when the sector or block is erased. With this conventional scheme, an erase operation generally includes pre-program of all cells in a sector or block, erase of all cells, and clean up of any over-erased cell. The erase operation is a time consuming process.

The disclosed innovation herein provides systems and methodologies for facilitating erasing a flash device using a single logical cell erasure and a dynamic erase state. The single logical cell erasure can be accomplished on a basis of a single program and erase entity which is a combination of neighboring drain/source regions of two adjacent physical memory cells. Logical cell mapping is changed from using a single physical memory cell to using two adjacent physical cells as a single logical cell. This combination can allow for single bit erase and program with conventional technologies.

The dynamic erase state can involve an indicator bit that indicates an erase direction of a low voltage state (e.g., low VT state) or a high voltage state (e.g., high VT state). When an indicator cell indicates a low voltage state, the single logical cell erasure can be accomplished by changing a voltage state of a single program and erase entity from a high voltage state to a low voltage state. When the indicator cell indicates a high voltage state, the single logical cell erasure can be accomplished by changing a voltage state of a single program and erase entity from a low voltage state to a high voltage state. By employing the indicator bit with the single program and erase entity decoding scheme, the methods and systems can reduce erase time and/or a number of cycles, thereby increasing system reliability, efficiency, and/or durability.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

BRIEF DESCRIPTION OF THE DRAWINGS

FIGS. 19a and 19b illustrate tables depicting exemplary mapping of voltage levels to a one-bit binary value in accordance with one aspect of the specification.

FIG. 27 is a table for depicting an exemplary mapping of an erase direction indicator bit to a one-bit binary value in accordance with one aspect of the specification.

DETAILED DESCRIPTION

Figure 1:
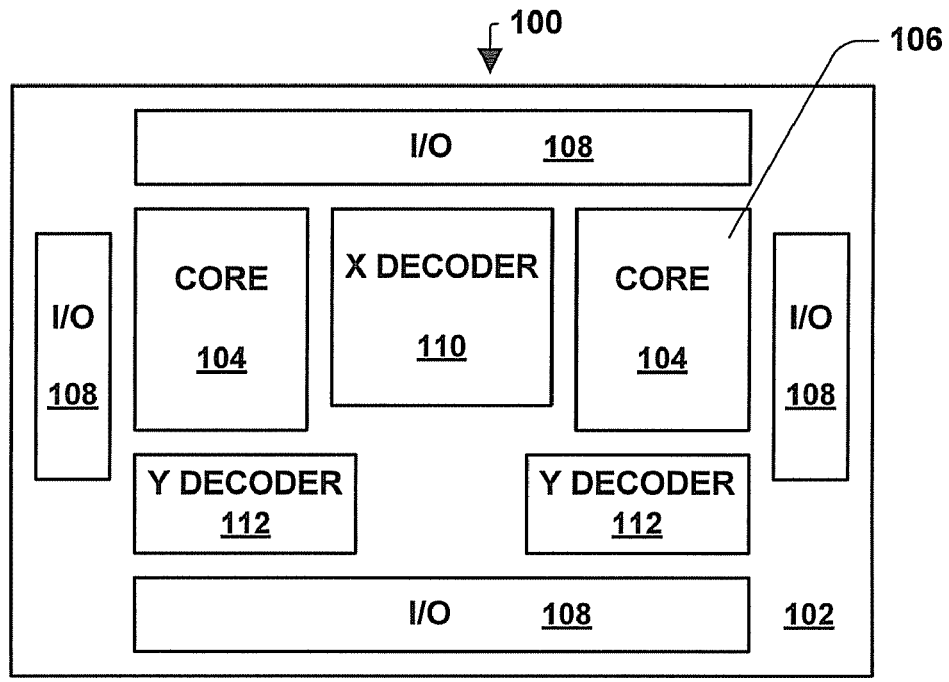
FIG. 1 is a top view of an exemplary dual bit flash device in accordance with one aspect of the specification.

Flash memory is a type of semi conductor computer memory with many desirable characteristics. Like read only memory, ROM, it is non-volatile, meaning that the contents of the memory are stable and retained without applied electrical power. A major advantage of flash over ROM is that the memory contents of flash can be changed after the device is manufactured. However, flash memory generally can not be written to, or programmed, at rates comparable to random access memory, RAM. Further, flash generally must be erased, either in its entirety or in large segments called sector or blocks, prior to changing its contents since pairs of memory cells share a bitline.

Typically, a conventional flash memory cell is described as being either in a low voltage state or low VT state (e.g., erased state) or a high voltage state or high VT state (e.g., programmed state). The low voltage state (e.g., erased state) is typically assigned to a binary value "1" and the high voltage state (e.g., programmed state) is typically assigned to a binary value 0.

Conventional flash memories generally allow bit changes only in one direction. A binary value "1" stored in a flash memory cell can be changed to a binary value "0" by a programming operation. Changing a binary value "0" by a programming operation into a binary value "1," however, is generally not possible. Changing programmed cells (binary value "0") to the logic state "1" is only possible with an erase operation. An erase operation cannot be performed on single bits, but only on a larger amount of data.

A page, sector, block, or array of conventional flash memory is generally erased before new data are stored in that page, sector, block, or array. Erasing is performed as a blanket operation wherein a page, sector, block, or array of memory cells is simultaneously erased. This conventional erase process is referred to as a page erase, sector erase, block erase, or flash erase (hereinafter, collectively referred to as a "sector erase"). The sector erase is generally a long process, typically measured in hundreds of milliseconds. Conventional flash memories do not support single logical cell erasure. As a result, conventional flash memories do not support byte alterability. This is a disadvantage compared to RAM and hard drives, which can be written directly, without an interposing erasure.

The subject innovation described herein provides systems for facilitating a single logical cell erasure in a flash memory device. The single logical cell erasure can be accomplished by employing a single program and erase entity as a single logical cell. The single program and erase entity is a combination of neighboring drain/source regions of two adjacent memory cells. By mapping two adjacent physical cells as a single logical cell (e.g., single program and erase entity), the flash memory device can be programmed and erased on a byte or variable length basis.

The flash memory device that can be employed in the subject innovation can contain dual bit memory cells or mirror bit memory cells (hereinafter, collectively referred to as a "dual bit memory cell") that have a semiconductor substrate with implanted conductive bitlines. The dual bit memory cell contains a charge trapping dielectric layer that can contain one or more layers and can be formed over the semiconductor substrate. For example, the charge trapping dielectric layer contains three separate layers: a first insulating layer, a charge trapping dielectric layer, and a second insulating layer. Wordlines are formed over the charge trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement. The details of the structure and manufacture of the dual bit flash memory device are not critical to the practice of the subject innovation. The details of the structure and manufacture of the dual bit flash memory device can be found in, for example, commonly-assigned U.S. Pat. No. 7,176,113, issued Feb. 13, 2007, which is hereby incorporated by reference.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

FIG. 1 illustrates a top view of an exemplary dual bit flash device 100. The flash device 100 generally includes a semiconductor substrate 102 in which one or more high-density core regions 104 and one or more lower-density peripheral portions are formed. The high-density core regions 104 include one or more M by N arrays of individually addressable, substantially identical single program and erase entities 106. The single program and erase entities include two adjacent dual bit flash memory cells.

The lower-density peripheral portions on the other hand typically include input/output (I/O) circuitry 108 and programming circuitry for selectively addressing the individual single program and erase entities. The programming circuitry is represented in part by and includes one or more wordline decoders 110 and one or more bitline decoders 112 that cooperate with the I/O circuitry 108 for selectively connecting a source, gate, and/or drain of selected addressed single program and erase entities to predetermined voltages or impedances to effect designated operations on the respective single program and erase entities (e.g., programming, reading, and erasing, and deriving necessary voltages to effect such operations). In one embodiment, the dual bit flash device 100 is a trap based NOR flash device.

Figure 2:
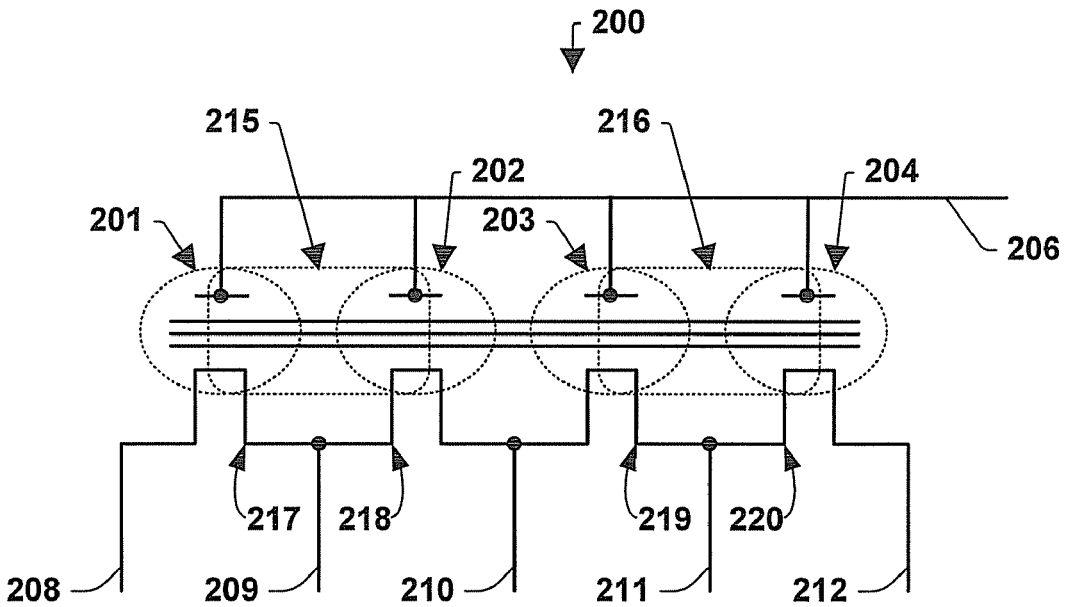
FIG. 2 is a schematic illustration of a portion of an exemplary memory core, such as can include at least part of one of the cores depicted in FIG. 1 in a virtual ground type configuration in accordance with one aspect of the specification.

FIG. 2 is a schematic illustration of a portion 200 of an exemplary memory core such as can include at least part of one of the M by N array cores 104 depicted in FIG. 1. The circuit schematic shows a group of physical memory cells 201 through 204 in a virtual ground type implementation, for example. The respective physical memory cells 201 through 204 are connected to a wordline 206, which serves as a control gate, and pairs of the physical memory cells share a bitline. For instance, in the example shown, the physical memory cell 201 has associated bitlines 208 and 209; the physical memory cell 202 has associated bitlines 209 and 210; the physical memory cell 203 has associated bitlines 210 and 211; and the physical memory cell 204 has associated bitlines 211 and 212. As such, cells 201 and 202 share bitline 209, cells 202 and 203 share bitline 210 and cells 203 and 204 share bitline 211, respectively. In the subject innovation, two adjacent physical memory cells can be combined to provide a single program and erase entity 215, 216 as a single logical cell. Depending upon a signal on the wordline and the connection of the bitlines in a single program and erase entity to an electrical source or drain, the single program and erase entities are capable of writing, reading, and erasing bits at locations 217 through 220.

Figure 3:
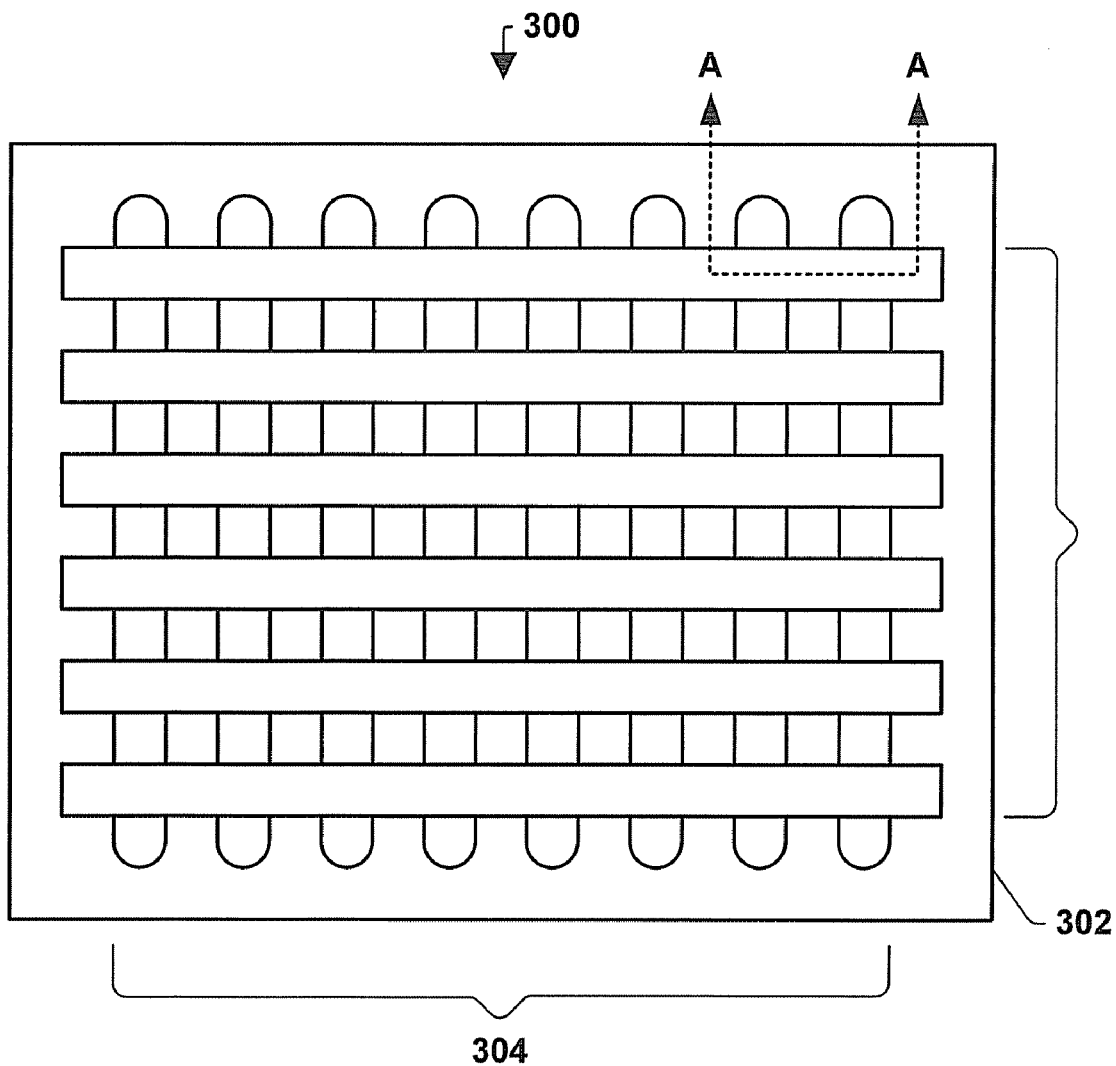
FIG. 3 is a top view of a portion of an exemplary memory core, such as can include at least part of one of the cores depicted in FIG. 1 in accordance with one aspect of the specification.

FIG. 3 illustrates a top view of a portion 300 of an exemplary memory core, such as can include the M by N array cores 104 depicted in FIG. 1. The memory 300 can be formed upon a semiconductor substrate 302 and have a plurality of implanted bitlines 304 extending substantially parallel to one another, and further include a plurality of formed wordlines 306 extending substantially in parallel to one another and at substantially right angles to the plurality of implanted bitlines 304. It will be appreciated that the wordlines 306 and bitlines 304 have contacts and interconnections (not shown) to programming circuitry such as can be represented, at least in part, by wordline decoders and bitline decoders.

Figure 4:
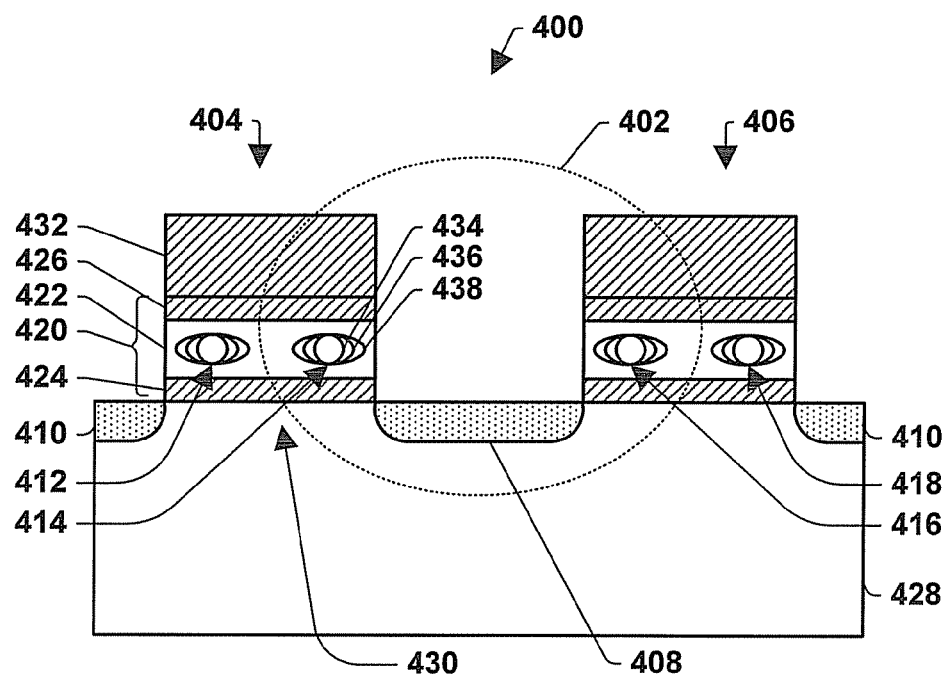
FIG. 4 is a cross sectional view of a portion of an exemplary memory device containing a single program and erase entity, such as that taken along line A-A of FIG. 3 in accordance with one aspect of the specification.

FIG. 4 is a cross sectional view of a portion of an exemplary memory device 400 containing a single program and erase entity as indicated by a dashed line 402, such as that taken along line A-A of FIG. 3. The single program and erase entity 402 can contain two adjacent physical memory cells 404, 406 that share a common bitline 408. The single program and erase entity can contain other two bitlines 410 that are not shared by the two adjacent physical memory cells 404, 406 (hereinafter, referred to as "non-common bitlines").

The physical memory cell 404, 406 can be a dual bit memory cell. The physical memory cell 404, 406 has dual bit locations 412, 414, 4144, 418 where a charge can be stored. As will be described in detail below, the single program and erase entity 402 can store varying degrees of charge at two locations 414, 416 close to the common bitline 408. It will be appreciated that the physical memory cell 404, 406 can correspond to the physical memory cells 201 through 204 depicted in FIG. 2.

The physical memory cell 404, 406 typically includes a charge trapping dielectric layer 420 that contains a charge trapping layer 422 sandwiched between two dielectric layers 424, 426. In one embodiment, the two charge storage nodes 412, 414 are physically separated by a central dielectric (not shown) in the charge trapping dielectric layer 420. The configuration and/or constituent of the charge trapping dielectric layer 420 can vary and are not critical to the subject innovation. The charge trapping dielectric layer 420 can contain a first insulating layer 424 (e.g., a bottom dielectric layer or a tunneling dielectric layer), a charge trapping layer 420, and a second insulating layer 426 (e.g., a top dielectric layer). The first insulating layer 424 and/or the second insulating layer 426 can contain silicon oxide (e.g., $SiO_2$), other standard-K material (e.g., having a relative permittivity below ten), or a high-K material (e.g., having a relative permittivity, in one embodiment, above about ten and, in another embodiment, above about twenty).

The charge trapping dielectric layer 420 can contain any suitable charge trapping layer 422. Examples of charge trapping layers 422 include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the first and second dielectric layers 424, 426 contain oxide dielectrics such as silicon dioxide ($SiO_2$) and the charge trapping layer contains nitride dielectrics such as silicon nitride ($Si_xN_y$). The oxide-nitride-oxide configuration can be referred to as an ONO layer. Especially, when the nitride layer contains silicon rich nitride, the oxide-nitride-oxide configuration can be referred to as an ORO tri-layer. The oxide-nitride-oxide tri-layer can be fabricated by forming a first silicon oxide layer, forming a silicon nitride layer on the first silicon oxide layer, and forming a second silicon oxide layer on the silicon nitride layer. In another embodiment, the charge trapping dielectric layer 420 contains five separate layers, for example, oxide-nitride-polysilicon-nitride-oxide. The oxide-nitride-polysilicon-nitride-oxide configuration can be referred to as an ORPRO layer when the nitride layer contains silicon rich nitride.

The charge trapping layer 420 can be formed over a substrate 428 that can contain silicon or some other semiconductor material. The substrate 428 can be selectively doped with a p-type dopant, such as boron, for example, to alter its electrical properties. In the example illustrated, the substrate 428 has buried bitlines or bitline diffusions 408, 410. The bitline diffusions can be formed by an implanted n-type dopant such as arsenic, phosphorous, and antimony, and can correspond to bitlines 208 through 212 in FIG. 2. A channel 430 is defined within the substrate between the bitlines (e.g., S/D extensions, deep S/D regions).

Overlying the upper dielectric layer 426 of the charge trapping dielectric layer 420 is a gate 432. This gate 432 can be formed from a polysilicon material and can be doped with an n-type impurity (e.g., phosphorus) to alter its electrical behavior. The gate 432 can correspond to the wordlines 206 in FIG. 2. The gate 432 enables a voltage to be applied to the single program and erase entity 402 such that respective charges can, among other things, be stored within the single program and erase entity at locations 414, 416. As will be described in detail below, the physical memory cell 404, 406 of the single program and erase entity 402 can store different amounts of charge 434, 436, 438.

FIGS. 5-10 illustrate exemplary methods for trapping and neutralizing charges in charge trapping layers of single program and erase entities. By trapping charges in charge trapping layers, single program and erase entities can achieve a high voltage state (e.g., high VT state). By neutralizing charges in charge trapping layers, single program and erase entities can achieve a low voltage state (e.g., low VT state). FIGS. 5-10 illustrate the use of channel hot-electron-injection and hot-hole-injection to achieve the desired voltage state. It should be appreciated that the particular method and memory cell architecture illustrated by FIGS. 5-10 are only some of many possible high-voltage and/or high-current operations and memory cell architectures that can utilize the embodiments disclosed herein, and that all such operations and architectures are intended to fall within the scope of the hereto appended claims. A low voltage state may be referred to as a "low VT (low threshold voltage) state," and the low voltage state can be equivalent to the low VT state in some instances. A high voltage state may be referred to as a "high VT (high threshold voltage) state," and the high voltage state can be equivalent to the high VT state in some instances.

Figure 5:
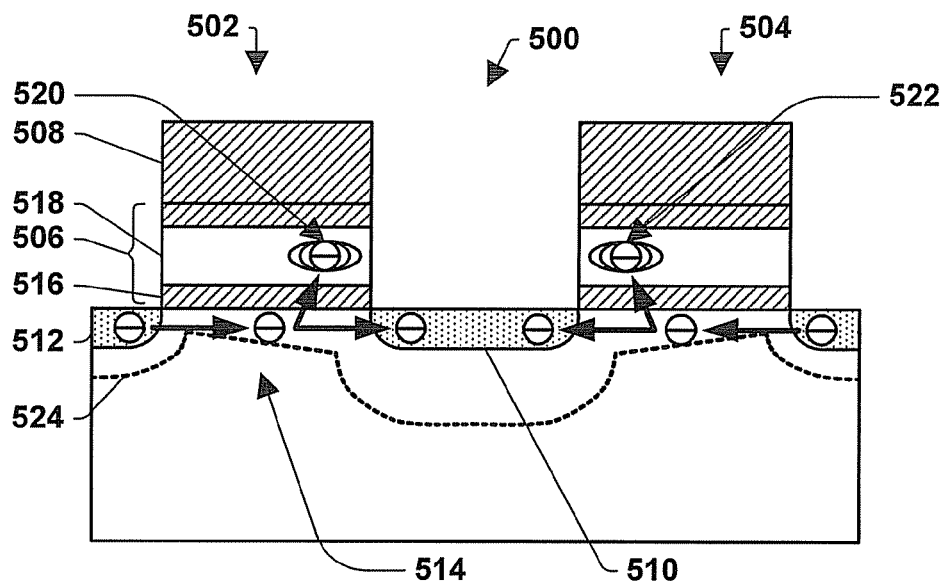
FIG. 5 is a cross-sectional view of an exemplary single program and erase entity wherein charges can be trapped in the single program and erase entity in accordance with one aspect of the specification.

FIG. 5 specifically illustrates a method for trapping charges in a single program and erase entity 500 containing two adjacent physical memory cells 502, 504. To trap charges in charge trapping layers 506 of single program and erase entities, a gate (e.g., a wordline) 508 can be set to high voltages (hereinafter, referred to as "hot-electron-injection gate voltage"), a common bitline 510 can be set to a predetermined potential above the non-common bitlines (hereinafter, referred to as "hot-electron-injection bitline voltage"), and non-common bitlines 512 that are not shared by the two adjacent physical cells can be connected to ground, left to float, or biased to a different voltage level. In one embodiment, the voltage across the wordline 508 can be about 9 volts and the voltage across the common bitline 510 can be about 4 volts. The applied voltages generate a vertical electric field through the charge trapping layer 506, and generate a lateral electric field across a length of the channel 514 from the non-common bitlines 512 to the common bitline 510. At a given voltage, the channels 514 invert such that electrons are drawn off the non-common bitlines and begin accelerating towards the common bitline.

As the electrons move along the length of the channel 514, the electrons gain energy and, upon attaining enough energy, the electrons jump over the potential barrier of the first dielectric layer (e.g., bottom dielectric layer) 516 and into the charge trapping layer 518, where the electrons become trapped. The probability of electrons jumping the potential barrier in this arrangement is a maximum at locations 520, 522 close to the common bitline 510, where the electrons have gained the most energy. These accelerated electrons are termed hot electrons and, once injected into the charge trapping layer 518, stay in about the general area indicated as charge trapping regions 520, 522. The trapped electrons tend to remain generally localized due to the low conductivity of the charge trapping layer 518 and the low lateral electric field therein.

The presence or absence of a trapped charge in the charge trapping layer 506 of the single program and erase entity 500 can then correspond to a bit of data stored by the single program and erase entity 500. The presence or absence of a trapped charge can be read by determining the existence of a trapped charge in the charge trapping layer 518 at that location. Although not shown in FIG. 5, for a read operation, in addition to voltages applied to the gate 508 (e.g., the wordline), the non-common bitlines 512 are connected to drains and the common bitline 510 is connected a source. The voltage applied to the gate 508 causes a current from the non-common bitlines 512 to the common bitline 510. The resulting current is measured, by which a determination is made as to the value of the data stored in the single program and erase entity 500. For example, if the current is above a certain threshold, the bit is deemed unprogrammed or a logical one, whereas if the current is below a certain threshold, the bit is deemed to be programmed or a logical zero.

In this example, by setting the common bitline 510 to high voltages while setting both non-common bitlines 512 to ground, charges are trapped in charge trapping layers 506 of the two adjacent physical memory cells 502, 504 at the same time. The dotted line 524 illustrates one possible path through which electrons can move as they pass from the non-common bitlines 512 to the common bitline 510 of the single program and erase entity 500 based on the voltages applied to the single program and erase entity 500. It should be appreciated that other electron paths are possible and that the exact path through which the electrons move can depend on the profile of the bitline junctions, the combination of the voltage across the wordline and the common bitline, and other appropriate factors.

Figure 6:
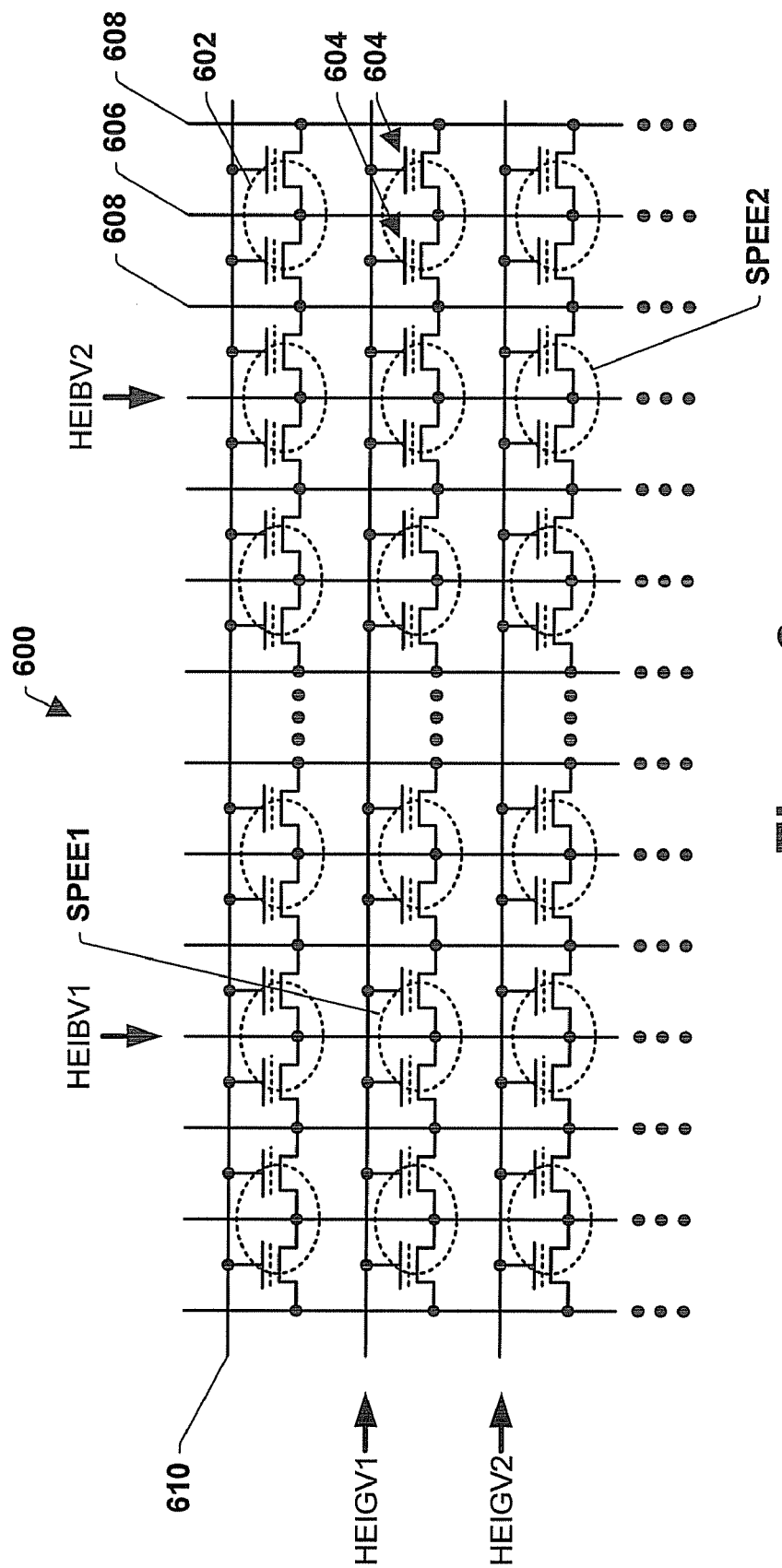
FIG. 6 is a schematic diagram illustrating a method for trapping charges in a single program and erase entity in accordance with one aspect of the specification.

FIG. 6 is a schematic diagram illustrating a method for trapping charges performed on an exemplary array 600 of single program and erase entities 602 as indicated by a dashed line. The single program and erase entities contain two adjacent physical memory cells 604. The two adjacent physical memory cells 604 share a common bitline 606. The single program and erase entities 602 are connected by other two bitlines 608 at both ends of the single program and erase entities. The other two bitlines 608 are not shared by the two adjacent physical memory cells that constitute a single program and erase entity; thus the other two bitlines are non-common bitlines. The physical memory cells 604 in the single program and erase entities 602 are also connected by wordlines. Since charges can be trapped in each single program and erase entity 602 by applying a suitable voltage on common bitlines 606 of the single program and erase entity 602, the method can be performed on any selected single program and erase entity. Also, charges can be trapped in any selected single program and erase entity without any substantial electrical effect on adjacent single program and erase entities.

Trapping charges in single program and erase entities 602 can be conducted by a suitable mechanism, such as hot-electron-injection. Trapping charges with hot-electron-injection involves applying a relatively high voltage to the control gate (e.g., wordline), connecting the non-common bitlines 608 to ground, and connecting the common bitline 606 to a predetermined potential above the non-common bitlines 608. When a resulting electric field is high enough, electrons collect enough energy to be injected from the non-common bitlines 608 onto charge trapping layers in the single program and erase entity 602. As a result of the trapped electrons in the charge tapping layers, the threshold voltage of the single program and erase entity 602 increases. This change in the threshold voltage (and thereby the channel conductance) of the single program and erase entity 602 created by the trapped electrons is what causes the single program and erase entity 602 to be programmed or erased.

The method for trapping charges is performed on single program and erase entities 602 that are disposed next to each other in rows. Since each single program and erase entity 602 contains two adjacent physical memory cells and the single program and erase entities 602 are disposed next to each other in rows, common bitlines 606 shared by the two adjacent physical memory cells are on every other line. In other words, the common bitlines 606 of single program and erase entities 602 exist alternately in rows. As a result, trapping charges involves applying a suitable voltage (e.g., hot-electron-injection voltage or programming voltage) to at most every other bitline in rows. The position of the bitline whose voltage state is changed can be sequentially shifted to every other bitline or shifted to any common bitline of selected single program and erase entities. In one embodiment, trapping charges involve applying a suitable voltage to only odd numbers of bitlines or only even numbers of bitlines. In another embodiment, trapping charges does not involve sequentially applying a suitable voltage (e.g., hot-electron-injection voltage or programming voltage) to every bitline or two or more consecutive bitlines in rows.

In FIG. 6, charges are trapped in a single program and erase entity (SPEE1) by applying a program gate voltage (PGV1) (e.g., a hot-electron-injection gate voltage (HEIGV1)) to a wordline 610, applying a program bitline voltage (PBV1) (e.g., a hot-electron-injection bitline voltage (HEIBV1)) to a common bitline 606 of SPEE1, and connecting non-common bitlines 608 of SPEE1 to ground. When subsequently trapping charges in another single program and erase entity (SPEE2), the charges can be trapped by applying a program gate voltage (PGV2) (e.g., a hot-electron-injection gate voltage (HEIGV2)) to a wordline, applying a programming bitline voltage (PBV2) (e.g., a hot-electron-injection bitline voltage (HEIBV2)) to a common bitline 606 of SPEE2, and connecting non-common bitlines 608 of SPEE2 to ground.

Figure 7:
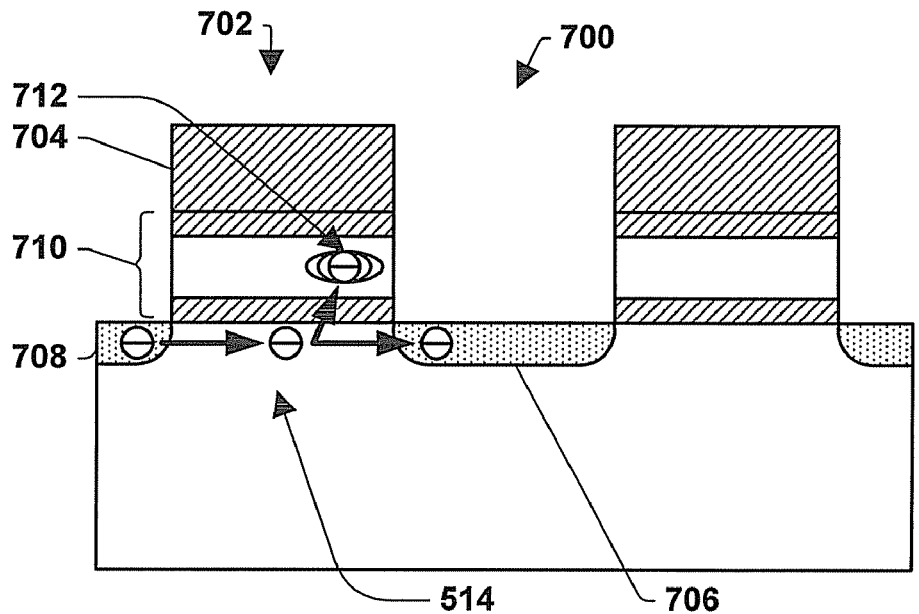
FIGS. 7 and 8 are cross-sectional views of an exemplary single program and erase entity wherein charges can be trapped in one physical memory cell of the single program and erase entity in accordance with one aspect of the specification.

In one embodiment, by applying the gate bias on one of the two adjacent physical memory cells of a single program and erase entity, one of the two physical memory cells can be programmed. FIG. 7 illustrates a programming operation performed on one physical memory cell of a single program and erase entity 700. Specifically, FIG. 7 illustrates a programming operation performed on a left physical memory cell 702 of a single program and erase entity 700. In this example, the wordline 704 and the common bitline 706 of single program and erase entity 700 can be set to high voltages and the non-common bitline 708 of the left physical cell 702 can be set to ground. As a result of the voltages applied to the left physical cell 702, electrons can be made to flow from the left non-common bitline 708 to the common bitline 706 and toward the charge trapping layer 710 of the left physical cell 702. A charge provided by the electrons that enter the charge trapping layer 710 of the left physical cell 702 can then become trapped in the charge trapping layer 710 of the left physical cell at a location 712 close to the common bitline 706, thereby enabling the single program and erase entity 700 to store a first bit of data in the left physical cell 702.

Figure 8:
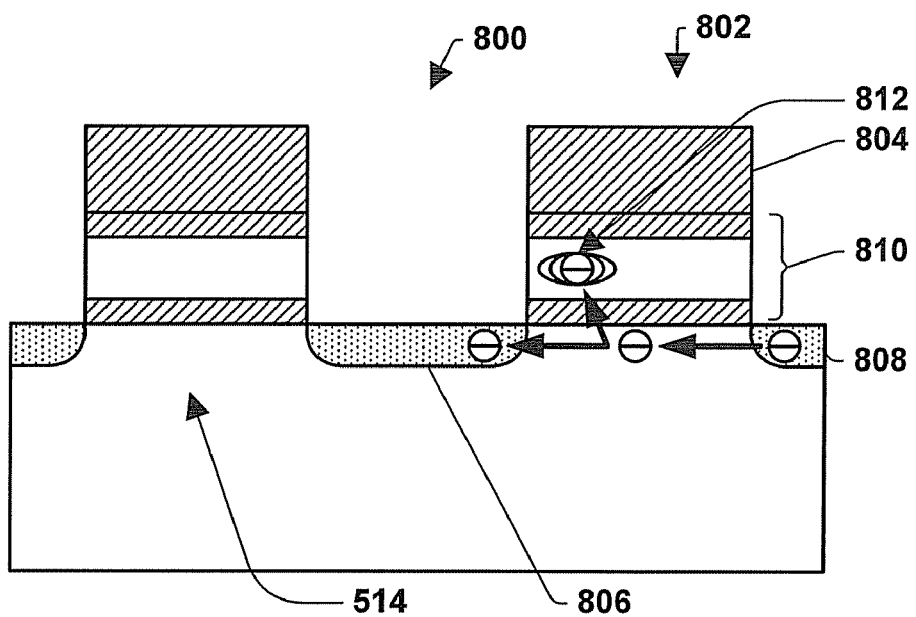

Similar to the programming operation illustrated in FIG. 7, the other physical cell can be programmed by applying a bias voltage on the other physical cell. FIG. 8 illustrates a programming operation performed on a right physical memory cell 802 of a single program and erase entity 800. In this example, the wordline 804 and the common bitline 806 of single program and erase entity 800 can be set to high voltages and the non-common bitline 808 of the right physical cell 802 can be set to ground. As a result of the voltages applied to the right physical cell 802, electrons can be made to flow from the right non-common bitline 808 to the common bitline 806 and toward the charge trapping layer 810 of the right physical cell 802. A charge provided by the electrons that enter the charge trapping layer 810 of the right physical cell 802 can then become trapped in the charge trapping layer 810 of the right physical cell 802 at a location 812 close to the common bitline 806, thereby enabling the single program and erase entity 800 to store a second bit of data in the right physical cell 802.

Figure 9:
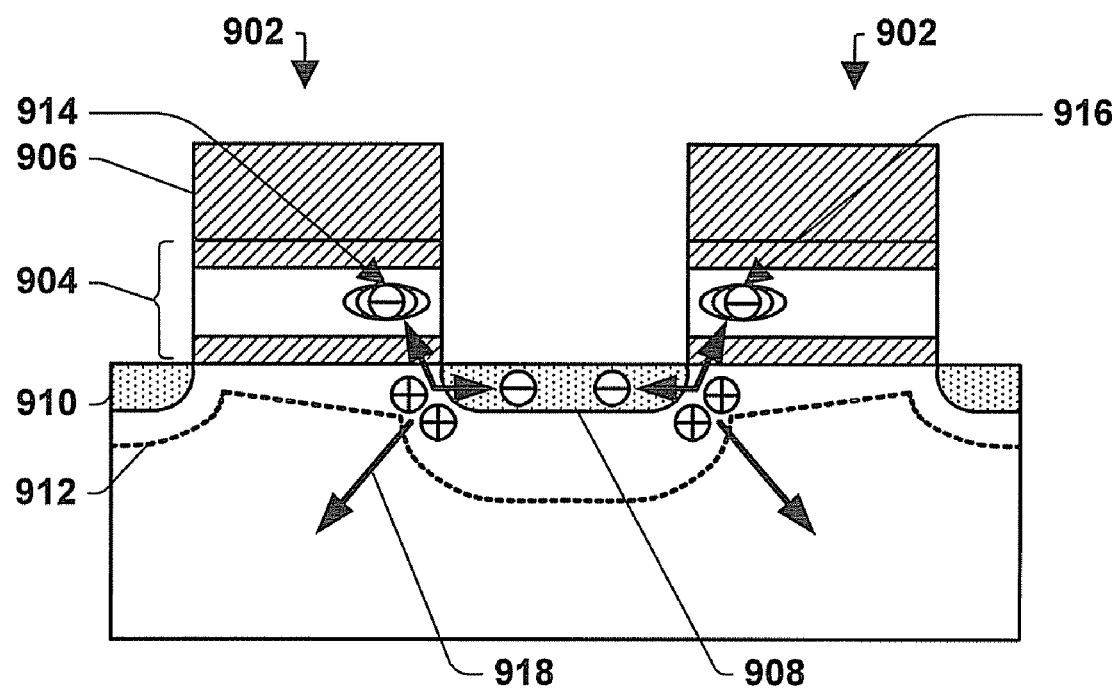
FIG. 9 is a cross-sectional view of an exemplary single program and erase entity wherein charges can be neutralized in the single program and erase entity in accordance with one aspect of the specification.

FIG. 9 illustrates a cross-sectional view of an exemplary single program and erase entity 900 wherein charges can be neutralized in the single program and erase entity. More particularly, FIG. 9 illustrates a method for neutralizing trapped charges in single program and erase entities via band-to-band hot-hole-injection. By neutralizing trapped charges in physical memory cells of single program and erase entities, the single program and erase entities can achieve a low voltage state. As will be described in detail below, the low voltage state can be assigned to an erased state or a programmed state.

To neutralize the charges, holes can be injected into the charge trapping layers 904 by applying a negative high voltage (hereinafter, referred to as "hot-hole-injection gate voltage") to a gate (e.g., wordline) 906 and a positive high voltage of substantially equal magnitude (hereinafter, referred to as "hot-hole-injection bitline voltage") to the common bitline 908 while allowing the non-common bitlines 910 to float. In one embodiment, the voltage across the wordline 906 is about −6 volts and the voltage across the common bitline 908 is about 6 volts. As a result of the neutralizing voltages applied to the single program and erase entity 900, the holes can be made to flow through the physical memory cells 902 in a path such as the path illustrated by dotted line 912. Further, the holes can be made to enter the charge trapping layers 904 near the common bitline 908, thereby releasing charges provided by electrons in the charge trapping layer 904 at charge trapping regions 914, 916. The charges can then flow out of the charge trapping layers 904 as a current 918.

Figure 10:
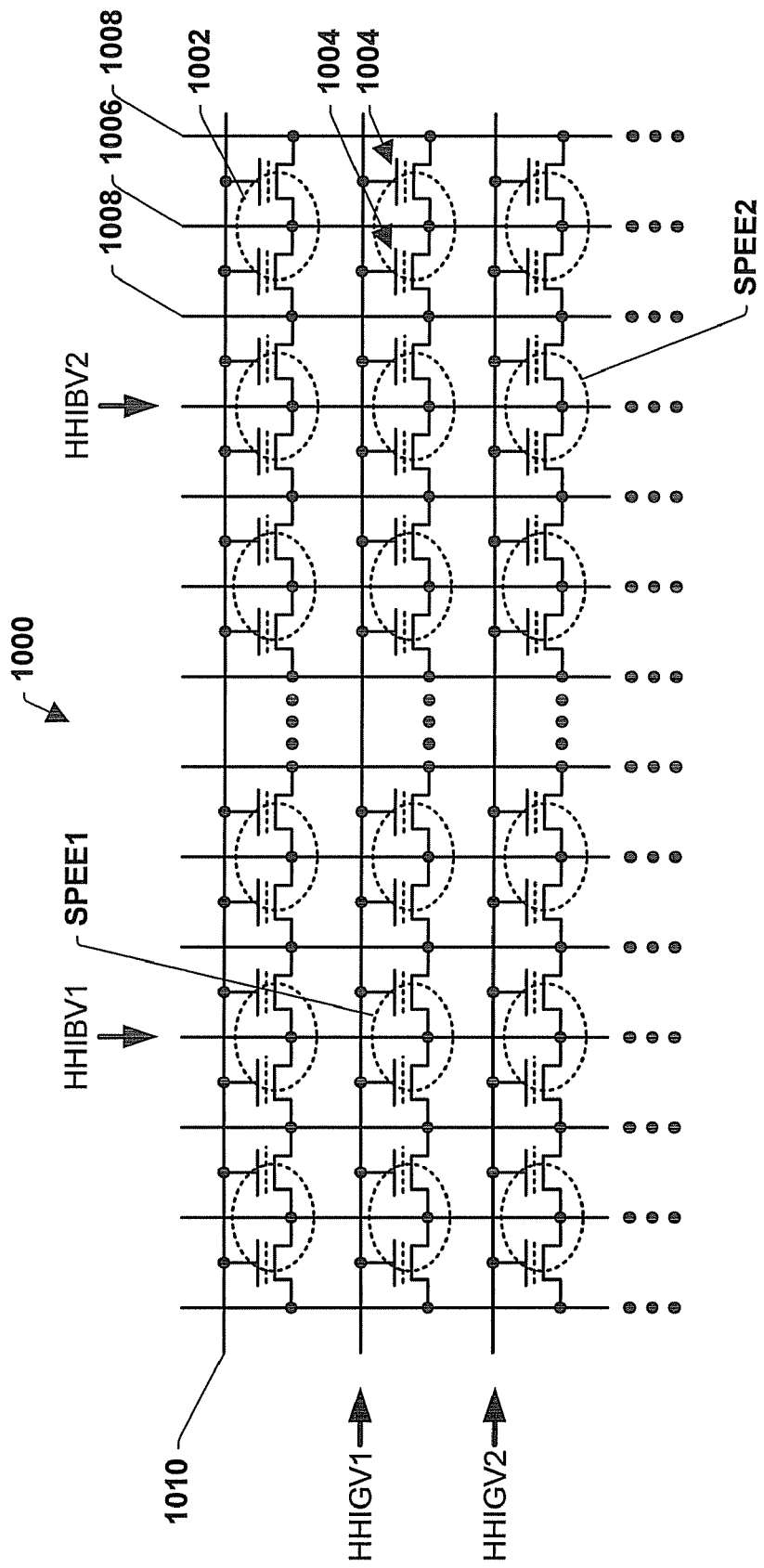
FIG. 10 is a schematic diagram illustrating a method for neutralizing charges in a single program and erase entity in accordance with one aspect of the specification.

FIG. 10 is a schematic diagram illustrating a method for neutralizing trapped charges performed on an exemplary array 1000 of single program and erase entities 1002 as indicated by a dashed line. Single program and erase entities 1002 contain two adjacent physical memory cells 1004 on a substrate (not shown). The two adjacent physical memory cells 1004 share a common bitline 1006. The single program and erase entities 1002 are connected by other two bitlines 1008 at both ends of the single program and erase entities. The other two bitlines are not shared by the two adjacent physical memory cells that constitute a single program and erase entity; thus the other two bitlines are non-common bitlines. The physical memory cells 1004 in the single program and erase entities 1002 are also connected by wordlines 1010. Since trapped charges can be neutralized in each single program and erase entity 1002 by applying a suitable voltage on common bitlines 1006 of the single program and erase entities, the method can be performed on any selected single program and erase entity 1002. Each single program and erase entity 1002 also can be erased without any substantial electrical effect on adjacent single program and erase entities.

Trapped charges can be neutralized by a suitable mechanism, such as a hot-hole-injection. Neutralizing charges with hot-hole-injection involves applying a negative high voltage to the wordline 1010 and a positive high voltage of substantially equal magnitude to the common bitline 1006 while allowing the non-common bitlines 1008 to float. These applied voltages cause the electrons that are trapped into the charge trapping layer to undergo either Fowler-Nordheim tunneling or hot hole neutralization through a first dielectric layer (e.g., thin tunnel oxide layer) to either a substrate (P-well) or a source/drain depending on the type of method being performed.

In FIG. 10, charges trapped in a single program and erase entity (SPEE1) are neutralized by applying an erase gate voltage (e.g., a hot-hole-injection gate voltage (HHIGV1)) to a wordline 1010, applying an erase bitline voltage (e.g., a hot-hole-injection bitline voltage (HHIBV1)) to a common bitline 1006, and allowing non-common bitlines 1008 to float. When subsequently neutralizing charges in another single program and erase entity (SPEE2), the charges can be neutralized by applying a hot-hole-injection gate voltage (HHIGV2) to a wordline 1010, applying a hot-hole-injection bitline voltage (HHIBV2) to a common bitline 1006 of the single program and erase entity, and allowing non-common bitlines 1008 of the single program and erase entity to float.

Single program and erase entities 1002 are disposed next to each other in rows. Since each single program and erase entity 1002 contains two adjacent physical memory cells 1004, common bitlines 1006 shared by the two adjacent physical memory cells 1004 of single program and erase entities are on every other line in rows. In other words, the common bitlines 1006 of single program and erase entities 1002 exist alternately in rows. As a result, a method for neutralizing charges involves applying a suitable neutralizing voltage (e.g., hot-hole-injection voltage) to at most every other bitline in rows. The position of the bitline whose voltage state is changed can be sequentially shifted to every other bitline or shifted to any bitline of selected single program and erase entities. In one embodiment, a method for neutralizing charges involves applying a suitable voltage to only odd numbers of bitlines or only even numbers of bitlines. In another embodiment, a method for neutralizing charges does not involve sequentially applying a hot-hole-injection bitline voltage to every bitline, or two or more consecutive bitlines in rows. In yet another embodiment, a method for neutralizing charges does not involve a sector erase.

Figure 11:
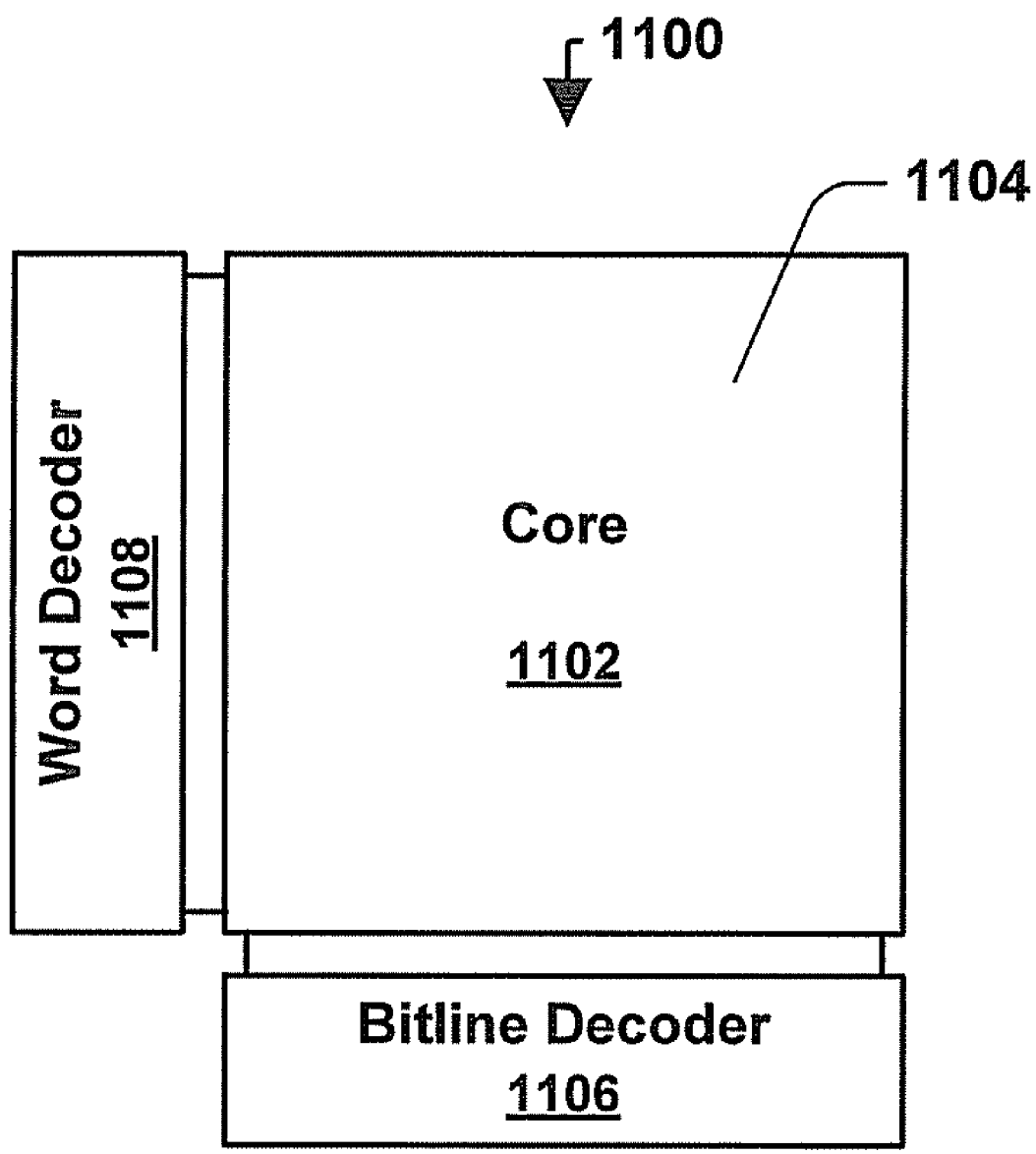
FIG. 11 is a schematic diagram of an exemplary system for operating a flash device that contains a plurality of single program and erase entities in accordance with one aspect of the specification.

FIG. 11 illustrate a flash device 1100 for operating a flash device using single program and erase entities. The flash device can contain a memory core 1102 containing a plurality of single program and erase entities 1104 and one or more decoders such as a bitline decoder 1106 (e.g., Y decoder or column decoder) and a wordline decoder 1108 (e.g., X decoder or row decoder). The bitline decoder and the wordline controller can decode I/Os during various operations that are performed on the single program and erase entities (e.g., programming, reading, erasing).

Two adjacent physical memory cells in any suitable portion of or an entire of the memory array 1102 can be mapped as a single program and erase entity. Various operations can be performed on the flash device 1100 according to the mapping. Single program and erase entities can be selected by decoders, and programming, reading, and/or erasing are performed on a basis of the single program and erase entity.

The decoders 1106, 1108 can facilitate operating a portion of or an entire of the memory array on the basis of the single program and erase entity. The bitline decoder can select one or more columns and the wordline decoder can select one or more rows. Any suitable decoder can be employed as long as the decoder can select one or more single program and erase entities for access. In one embodiment, while operating a flash memory, the decoders do not perform a sector erase in a portion of or an entire of a memory core. In other words, in one embodiment, a bitline decoder does not sequentially select two or more consecutive bitlines for applying an erase bitline voltage. In another embodiment, the decoders do not select bitlines between the single program and erase entities (e.g., non-common bitlines) for applying an erase bitline voltage.

The decoders 1106, 1108 can select one or more single program and erase entities in response to received addresses. The decoders can select one or more addresses by any suitable technique. In one embodiment, a table (e.g., a lookup table) is employed to implement decoders. The table can drive a register-transfer-level (RTL) description to implement decoders (e.g., bitline decoders). The decoders can be a table-driven decoder.

Figure 12:
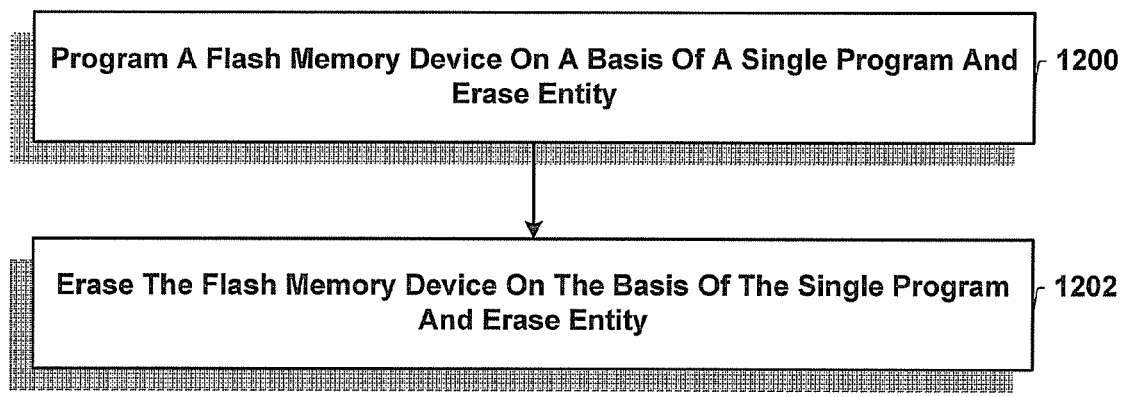
FIG. 12 is a flow diagram of an exemplary methodology for operating a flash device using single program and erase entities in accordance with one aspect of the specification.

FIG. 12 is a flow diagram of an exemplary methodology for operating a flash device using single program and erase entities. At 1200, a flash device is programmed on a basis of a single program and erase entity. The single program and erase entity includes two adjacent dual bit physical memory cells of the flash device as a single logical cell. At 1204, the flash device is erased on the basis of the single program and erase entity. The flash device can be programmed and then erased on the basis of the single program and erase entity. In another embodiment, the flash device can be erased and then programmed on the basis of the single program and erase entity.

Although not shown in FIG. 12, while erasing a portion of or an entire of the flash device on the basis of the single program and erase, a sector erase is not performed in the portion of or the entire of the flash memory. In another embodiment, while erasing a portion of or an entire of the flash device on the basis of the single program and erase, an erase pulse is not sequentially applied to two or more consecutive bitlines in the portion of or the entire of the flash memory.

The various operations (e.g., programming, erasing, reading) are performed on a basis of a single program and erase entity. In one embodiment, programming the flash memory device on a basis of a single program and erase entity involves applying a program pulse to a portion of or an entire of the flash memory on the basis of the single program and erase entity. In another embodiment, programming the flash memory device on a basis of a single program and erase entity involves applying a program gate voltage to a gate, applying a program bitline voltage to a common bitline of the single program and erase entity that is shared by the two adjacent dual bit physical memory cells, and connecting at least one of non-common bitlines of the single program and erase entity that are not shared by the two adjacent dual bit physical memory cells to ground. The program gate voltage can include a hot-electron-injection gate voltage and the program bitline voltage can include a hot-electron-injection bitline voltage.

Erasing can be performed on a basis of a single program and erase entity. In one embodiment, erasing the flash device on the basis of the single program and erase entity involves applying an erase pulse to a portion of or an entire of the flash memory on the basis of the single program and erase entity. In another embodiment, erasing the flash device on the basis of the single program and erase entity involves applying a erase gate voltage to a gate, applying a erase bitline voltage to a common bitline of the single program and erase entity that is shared by the two adjacent dual bit physical memory cells, and allowing non-common bitlines of the single program and erase entity that are not shared by the two adjacent dual bit physical memory cells to float. The erase gate voltage includes a hot-hole-injection gate voltage and the erase bitline voltage includes a hot-hole-injection bitline voltage.

Each bit of physical memory cells of single program and erase entities can be programmed to multiple levels. When voltages utilized to program single program and erase entities are increased or sustained for longer periods of time, the number of electrons or amount of charge stored in the single program and erase entities can be increased or otherwise varied. This allows the single program and erase entities to be utilized for additional data storage and/or programming states. For example, different amounts of charge can correspond to different programmed states. This technique is also called multi-level cell technology, which is useful to increase density and reduce manufacturing costs.

In one embodiment, dual bit physical memory cells of single program and erase entities contain storage nodes having two different states or levels, for example, 1 and 2. Level 1 can correspond to a situation where the storage nodes are blank or un-programmed, and level 2 can correspond to programmed. By way of illustration, charge storage nodes 414 and/or 416 described in FIG. 4 can have two different states or levels.

Figure 13:
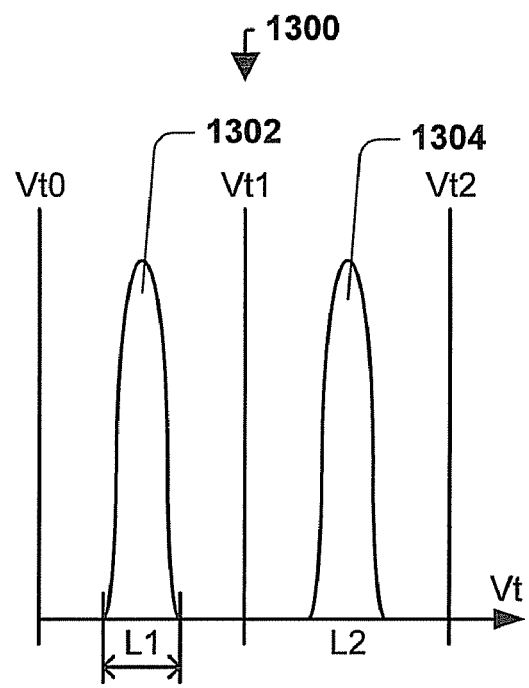
FIGS. 13-15 illustrate Vt distributions of a physical memory cell of a single program and erase entity in accordance with one aspect of the specification.

FIG. 13 is a graph 1300 illustrating an unsigned Vt distribution 1302, 1304 of a charge storage node. The Vt distribution represents a population of physical memory cell threshold voltages centered about two discrete target threshold voltages. Each target threshold voltage occupies a range of Vt values designated by levels L1 and L2, respectively. Each level can be centered between upper and lower Vt limits (e.g., Vt0, Vt1, and Vt2). The various levels can be arbitrarily assigned corresponding binary states (e.g., L1=0 and L2=1, or L1=1 and L2=0) as desired by the user. When two storage nodes adjacent to common bitlines of single program and erase entities are programmed at the same time as described in FIG. 5, the single program and erase entities can be programmed to two levels. When the two storage nodes adjacent to common bitlines of single program and erase entities are programmed independently from each other as described in FIGS. 7 and 8, the single program and erase entities can be programmed to multiple levels such as four.

In another embodiment, dual bit physical memory cells of single program and erase entities contain storage nodes having four different states or levels, namely 1, 2, 3, and 4. Level 1 can correspond to a situation where the storage nodes are blank or un-programmed, and levels 2, 3 and 4 correspond to increased amounts of stored charge, respectively. By way of illustration, a level 2 can correspond to a relatively small amount of stored charge 434 in FIG. 4, while levels 3 and 4 can correspond to increasingly larger amounts of stored charge 436 and 438 in FIG. 4, respectively.

Figure 14:
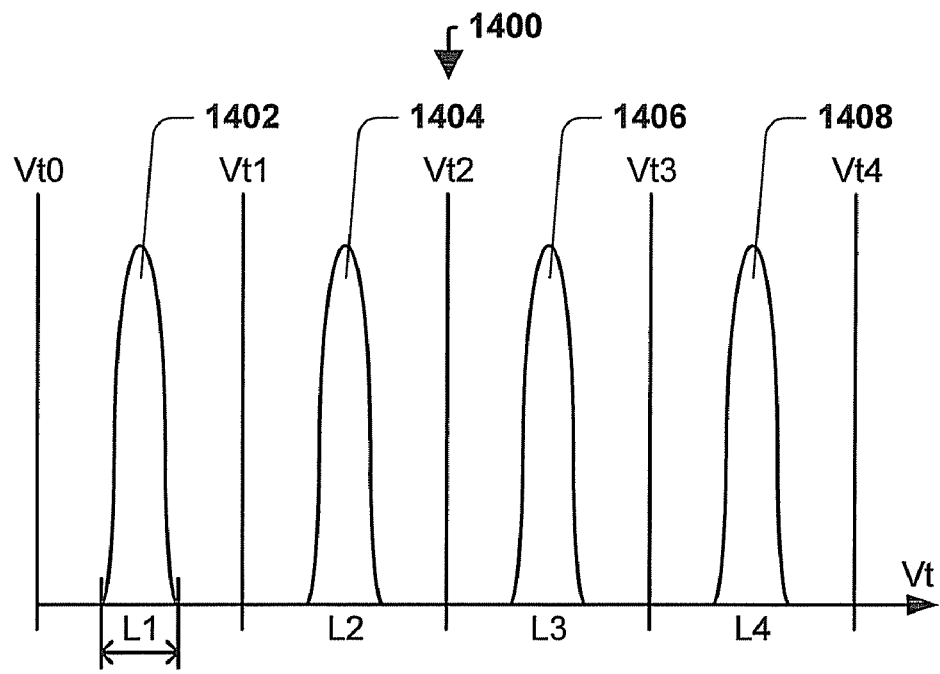

FIG. 14 is a graph 1400 illustrating a four level of Vt distribution 1402, 1404, 1406, 1408. Vt distribution 1400 represents a population of memory cell threshold voltages centered about four discrete target threshold voltages. Each target threshold voltage occupies a range of Vt values designated by levels L1, L2, L3, and L4, respectively. Each level can be centered between upper and lower Vt limits, for example, Vt0, Vt1, Vt2, Vt3, and Vt4. In one embodiment, target threshold voltages Vt2, Vt3, and Vt4 can, for example, have values such as Vt2=1.5V, Vt3=2.1V, and Vt4=2.7V.

The various levels can be arbitrarily assigned corresponding binary states (e.g., L1=11, L2=10, L3=01, and L4=00, or L1=00, L2=01, L3=10, and L4=11) as desired by the user. When two storage nodes adjacent to common bitlines of single program and erase entities are programmed at the same time as described in FIG. 5, the single program and erase entities can be programmed to four levels. When the two storage nodes adjacent to common bitlines of single program and erase entities are programmed independently from each other as described in FIGS. 7 and 8, the two storage nodes can be programmed to multiple levels such as sixteen different combinations of charge (e.g., L1-L1, L1-L2, L1-L3, L1-L4, L2-L1, L2-L2, L2-L3, L2-L4, L3-L1, L3-L2, L3-L3, L3-L4, L4-L1, L4-L2, L4-L3, and L4-L4) providing the equivalent of four-bits-per-entity. The sixteen voltage levels can corresponds to sixteen data states of a single program and erase entity.

Figure 15:
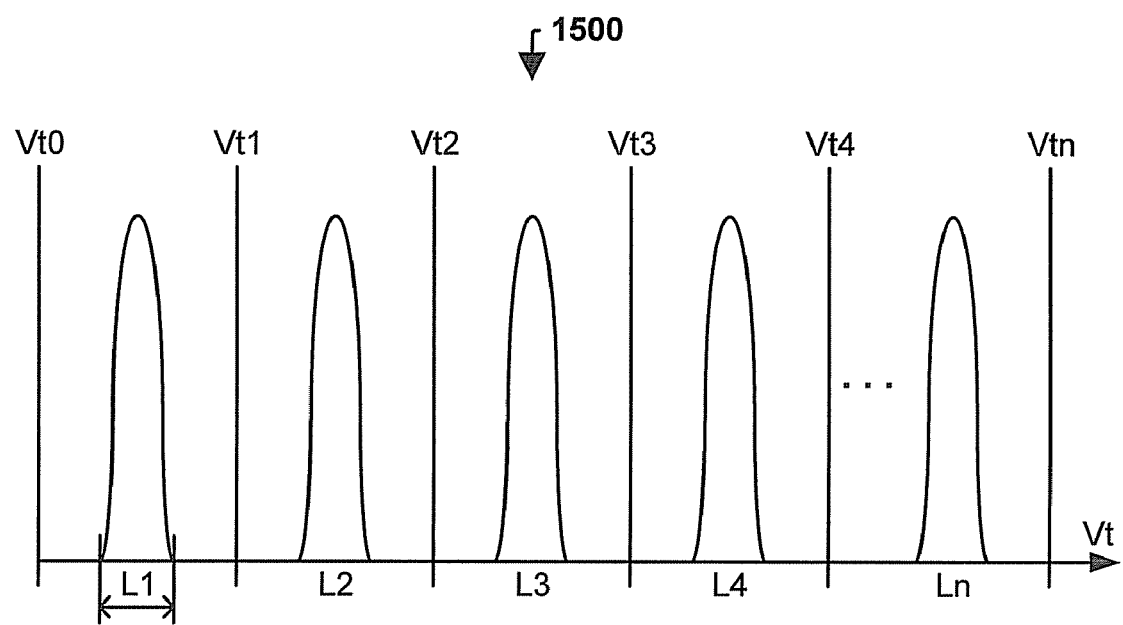

In a similar way to the four level charge storage node as described in FIG. 14, charge storage nodes of single program and erase entities can have any suitable number of levels. FIG. 15 illustrates an unsigned Vt distribution 1500 having n levels. When two storage nodes adjacent to common bitlines of single program and erase entities are programmed at the same time as described in FIG. 5, the single program and erase entities can be programmed to n levels. When the two storage nodes adjacent to common bitlines of single program and erase entities are programmed independently from each other as described in FIGS. 7 and 8, the single program and erase entities can be programmed to multiple levels such as $n^2$ providing the equivalent of high bit-per-entity. Single program and erase entities can contain physical memory cells having any suitable combination of both positive and negative Vt distributions. In FIG. 15, for example, Vt0, Vt4, or another such Vtn level can be used as a zero voltage potential or another reference potential of the memory cells.

Single program and erase entities containing multi-level physical cells can increase the effective logical cell density by increasing the number of possible logical states or data states, thereby allowing a single program and erase entity to store information corresponding to more than one data bit. This can be done by using multiple (three or more, in the context of cell levels and states) threshold voltage (Vt) levels, which correspond to multiple data states per entity.

The quantity of charge stored in each storage node can influence an amount of current that flows between a common bitline and non-common bitline during a read operation, as well as a threshold voltage (Vt) required to cause such current to flow. Thus, the level of stored bits in a storage node can be determined by examining the currents as well as corresponding applied threshold gate (wordline) voltages. In particular, low currents and high gate voltages can be indicative of higher bit levels. Thus, when physical memory cells contain four level charge storage nodes, measured currents and/or threshold voltages that fall within first, second, third or fourth ranges can be indicative of a level 1, level 2, level 3 or level 4, respectively for the stored bit.

Figure 16:
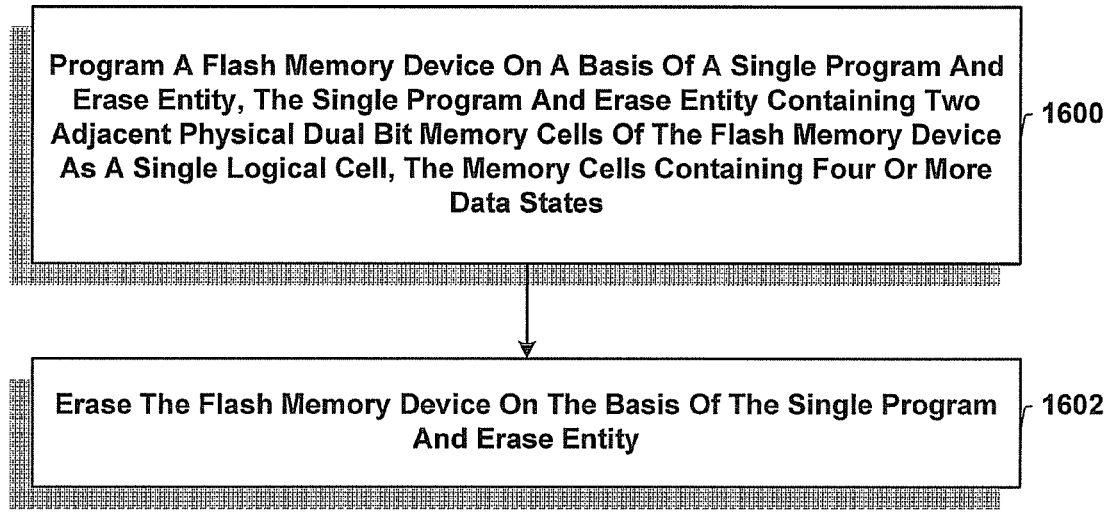
FIG. 16 is a flow diagram of an exemplary methodology for operating a flash device using single program and erase entities, and using memory cells containing four or more data states in accordance with one aspect of the specification.

FIG. 16 is a flow diagram of an exemplary methodology for operating a flash device using single program and erase entities and using memory cells containing four or more data states. At 1600, a flash device is programmed on a basis of a single program and erase entity. The single program and erase entity includes two adjacent dual bit physical memory cells of the flash device as a single logical cell. The dual bit physical memory cells can contain four or more data states. In one embodiment, each of the two adjacent dual bit physical memory cells can be programmed independently from each other. Since the memory cells contain four data states and each of the two adjacent dual bit physical memory cells can be programmed independently, the single program and erase entities can store four bits. Although not shown in FIG. 16, programming a portion of or an entire of the flash memory on the basis of the single program and erase entity can be performed by applying a program gate voltage to a gate, applying a program bitline voltage to a common bitline of the single program and erase entity that is shared by the two adjacent dual bit physical memory cells, and connecting at least one of two non-common bitlines of the single program and erase entity that are not shared by the two adjacent dual bit physical memory cells to ground.

At 1602, the flash device is erased on the basis of the single program and erase entity. The flash device can be programmed and then erased on the basis of the single program and erase entity. In another embodiment, the flash device can be erased and then programmed on the basis of the single program and erase entity. Although not shown in FIG. 16, in yet another embodiment, at least one of the two adjacent dual bit physical memory cells are selected by a decoder for programming the flash device and one or more single program and erase entities are selected by decoders for erasing the flash device.

Figure 17:
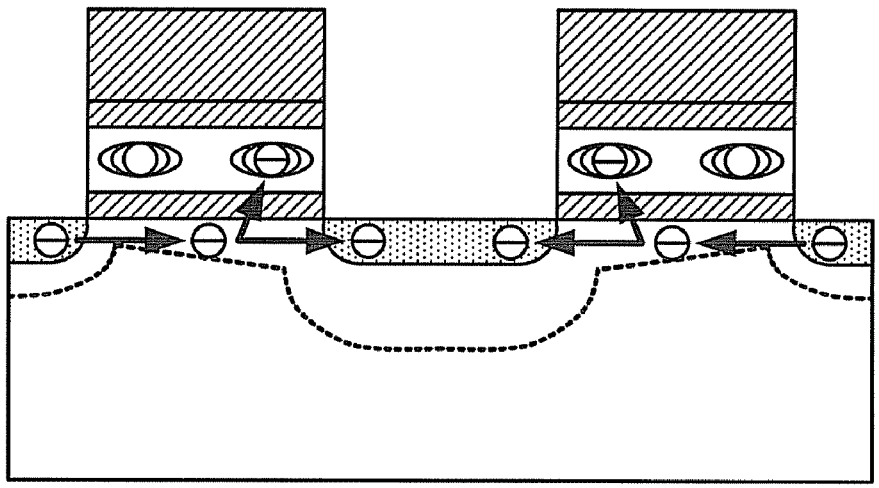
FIG. 17 illustrates cross-sectional views of an exemplary single program and erase entity wherein charges can be trapped and neutralized in the single program and erase entity in accordance with one aspect of the specification.
Figure 17:
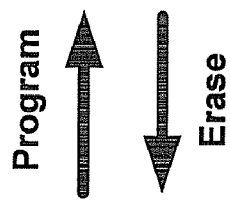
Figure 17:
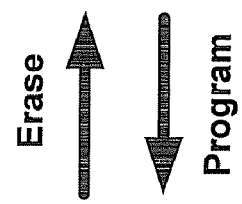
Figure 17:
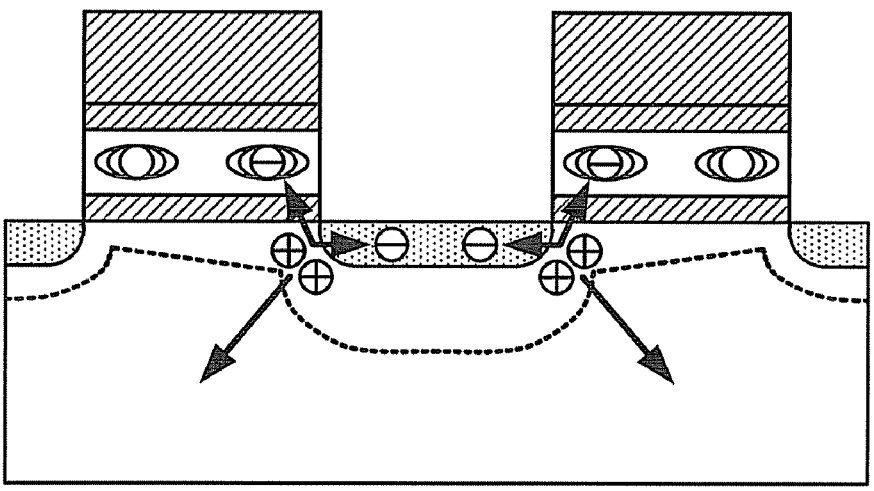

FIG. 17 illustrates cross-sectional views of an exemplary single program and erase entity wherein charges can be trapped and neutralized in the single program and erase entity. As disclosed above, trapping charges and neutralizing trapped charges in storage nodes can be performed on any selected single program and erase entity independently. Trapping charges and neutralizing trapped charges in storage nodes can be performed on a selected single program and erase entity without any substantial electrical effect on adjacent single program and erase entities. As a result, the subject innovation can provide two types of program and erase operations (Types 1 and 2).

In one embodiment, single program and erase entities are programmed to a high voltage state and erased to a low voltage state (Type 1). In other words, a high voltage state is assigned to a programmed state and a low voltage state is assigned to an erased state. The high voltage state in FIG. 17 can correspond to FIG. 5. The low voltage state in FIG. 17 can correspond to FIG. 9. In another embodiment, single program and erase entities are programmed to a low voltage state and erased to a high voltage state (Type 2). In other words, a low voltage state is assigned to a programmed state and a high voltage state is assigned to an erased state. Since trapping charges and neutralizing trapped charges in storage nodes can be performed on a single program and erase entity without any substantial electrical effect on adjacent single program and erase entities, erasing and programming can be accomplished on any suitable number of single program and erase entities such as on a byte or variable length basis.

Figure 18:
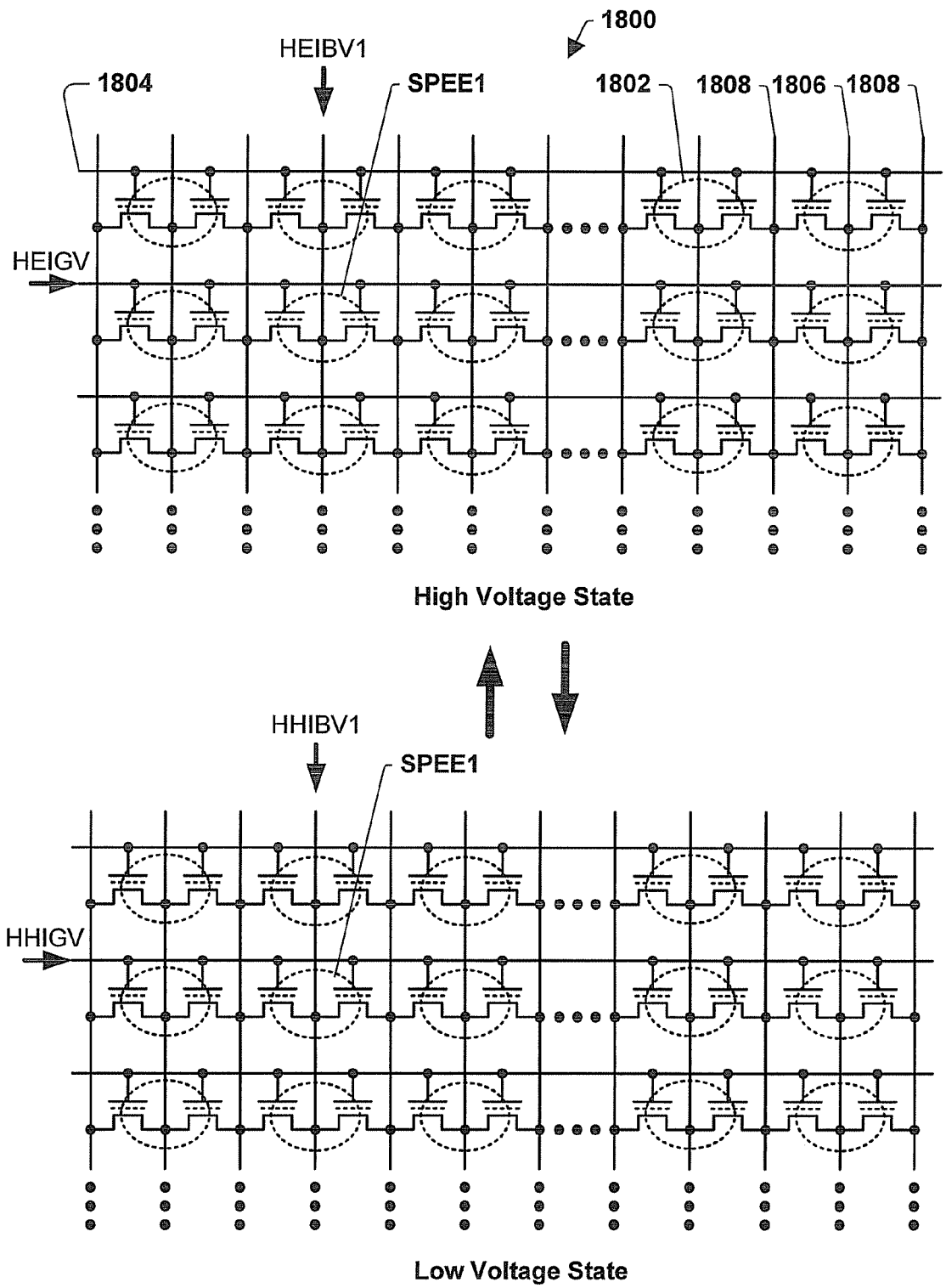
FIG. 18 is a schematic diagram illustrating a method for trapping charges and neutralizing trapped charges performed on an exemplary array of single program and erase entities in accordance with one aspect of the specification.

FIG. 18 is a schematic diagram illustrating a method for trapping charges and neutralizing trapped charges performed on an exemplary memory array 1800 of single program and erase entities 1802. Charges can be trapped in the same manner as described for trapping charges in connection with FIG. 6. Trapped charges can be neutralized in the same manner as described for neutralizing trapped charges in connection with FIG. 10. Trapping charges and neutralizing trapped charges can be performed on a basis of the single program and erase entity (e.g., in units of single program and erase entities). In one embodiment, neutralizing trapped charges does not require a sector erase. As a result, each single program and erase entity can be changed its voltage state independently from a high voltage state to a low voltage state and from a low voltage state to a high voltage state.

Trapping charges and neutralizing trapped charges can be performed on any suitable single program and erase entity in an array. Charges can be trapped in a single program and erase entity (SPEE1) by applying a hot-electron-injection gate voltage (HEIGV) to a wordline 1804, applying a hot-electron-injection bitline voltage (HEIBV1) to a common bitline 1806, and connecting non-common bitlines 1808 to ground. Trapped charges in SPEE1 can be neutralized by applying a hot-hole-injection gate voltage (HHIGV) to a wordline 1804, applying a hot-hole-injection bitline voltage (HHBV1) to a common bitline 1806, and allowing non-common bitlines 1808 to float. Since a sector erase is not required for neutralizing trapped charges, trapping charges and neutralizing trapped charges can be performed on the single program and erase entities at any suitable time without performing a sector erase. As a result, a high voltage state can be assigned to a programmed state and a low voltage state can be assigned to an erased state, or a low voltage state can be assigned to a programmed state and a high voltage state can be assigned to an erased state.

An erase operation of conventional flash memories is generally accomplished in one direction (e.g., from a high voltage state or binary value "0" to a low voltage state or binary value "1") on a sector-by-sector basis. As a result, a program operation of conventional flash memories is also generally accomplished in one direction (e.g., from a low voltage state or binary value "1" to a high voltage state or binary value "0"). The conventional sector erase is typically accomplished by a pre-program cycle, erase cycle, and soft program cycle. The pre-programming puts each memory cell in a high voltage state or a programmed state. This is accomplished by applying a program pulse to each memory cell to store a charge in the charge trapping layer. This is done to eliminate or reduce the chance of removing too many electrons from the memory cells during the erase process. Once the pre-programming has been completed, erasing can be performed by one or more applications of short erase pulses (e.g., an erase cycle). After each erase pulse, an erase verification or read is performed to determine if each cell in the array is now "erased" (blank), yet remains "un-erased," or "under-erased" (e.g., whether the cell has a threshold voltage above a predetermined limit). If an under-erased cell is detected, an additional erase pulse is applied to the entire sector, block, or array until all cells are sufficiently erased. With such a conventional erase procedure, however, some cells can become "over-erased" before other cells are sufficiently erased. A memory cell having a threshold voltage erased below a predetermined limit can be commonly referred to as being over-erased. For several reasons, it is undesirable for a memory cell to remain in an over-erased condition. If a memory cell is over-erased, the whole column can become leaky. When such an over-erased cell is detected, a soft program pulse is applied to the over-erased memory cell to pull its threshold voltage back into the normal population of erased cells (e.g., a soft-program cycle).

In the subject innovation, erasing can be accomplished in two directions, and programming can be also accomplished in two directions. The erase directions can include a first direction from a high voltage state or binary value "0" to a low voltage state or binary value "1," and a second direction from a low voltage state or binary value "1" to a high voltage state or binary value "0." The program direction include a first direction from a low voltage state or binary value "1" to a high voltage state or binary value "0," and a second direction from a high voltage state or binary value "0" to a low voltage state or binary value "1."

When single program and erase entities use a low voltage state as an erased state, an erase operation can be performed by applying a hot-hole-injection voltage to one or more selected single program and erase entities or all of the single program and erase entities (e.g., an erase cycle) and then soft-programming over-erased single program and erase entities (e.g., a soft-program cycle). In one embodiment, the erase operation does not require a pre-program cycle. When single program and erase entities use a high voltage state as an erased state, an erase operation can be performed by applying a hot-electron-injection voltage to one or more single program and erase entities or all of the single program and erase entities (e.g., pre-program cycle). In one embodiment, the erase operation does not require an erase cycle and/or a soft-program cycle. In both instances, the erase operations do not require all of the three cycles (e.g., a pre-program cycle, erase cycle, and soft program cycle). As a result, the erasing operations can reduce an erase time and reduce wear on single program and erase entities due to the reduced number of cycles. In addition, when single program and erase entities use a high voltage state as an erased state, the single program and erase entities can prevent or mitigate over erase problems.

FIGS. 19a and 19b illustrate tables 1900, 1902 depicting exemplary mapping of voltage levels to a one-bit binary value. Single program and erase entities can have a one-bit binary value when single program and erase entities have two discrete target threshold voltages as described in FIG. 13. Q1 represents bit values. In FIG. 19a, an erased state can be assigned to a binary value "1" and a programmed state can be assigned to a binary value "0." Arrows in FIG. 19 illustrate state transitions of single program and erase entities. Transition 1904 represents storing a binary "0" into single program and erase entities. Referring to FIG. 13, it can be seen that the transition 1904 represents a change in the charge distribution of single program and erase entities from region 1302 to region 1304, or an increase in voltage threshold, and transition 1906 represents a change from region 1304 to region 1302, or a decrease in voltage threshold.

In another embodiment of FIG. 19b, an erases state can be assigned to a binary value "0" and a programmed state can be assigned to a binary value "1." Referring to FIG. 13, it can be seen that transition 1908 represents a change in the charge distribution of single program and erase entities from region 1302 to region 1304, or an increase in voltage threshold, and transition 1910 represents a change from region 1304 to region 1302, or a decrease in voltage threshold.

Figure 20:
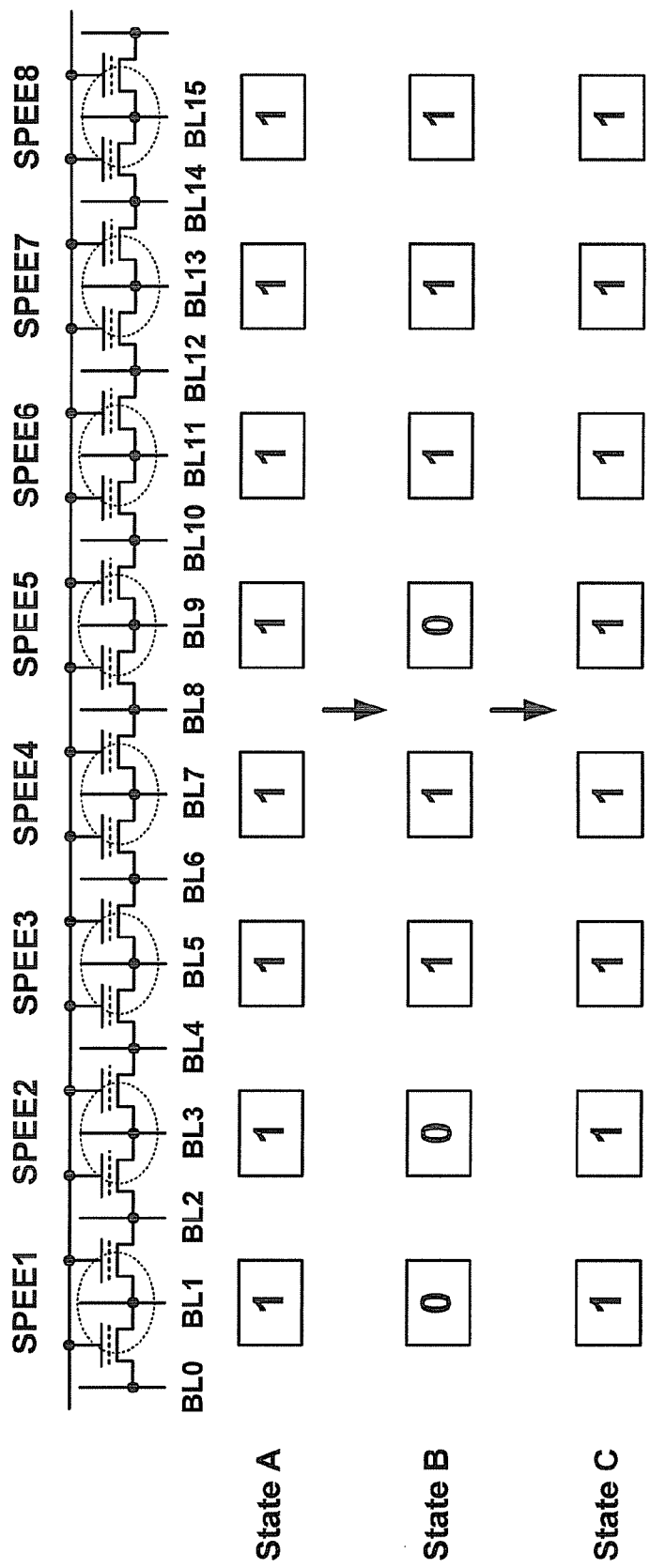
FIG. 20 is a schematic illustration for an exemplary method of programming and erasing single program and erase entities using a low voltage state as an erased state in accordance with one aspect of the specification.

FIG. 20 is a schematic illustration for an exemplary method of programming and erasing single program and erase entities using a low voltage state as an erased state. In this example, single program and erase entities use a low voltage state (e.g., binary value "1") as an erased state and a high voltage state (e.g., binary value "0") as a programmed state. All bits of single program and erase entities can be initially binary value "1" or an erased state (State A). Data can be programmed by changing a voltage state of selected single program and erase entities from a low voltage state to a high voltage state. In this example, a hot-electron-injection voltage is applied to SPEE1, SPEE2, and SPEE5, and the data are programmed to "0011 0111" (State B). Then, the programmed single program and erase entities can be erased by applying a hot-hole-injection voltage. In this example, a hot-hole-injection voltage is applied to all of the single program and erase entities, or SPEE1, SPEE2, and SPEE5, and the data are erased to "1111 1111."

Figure 21:
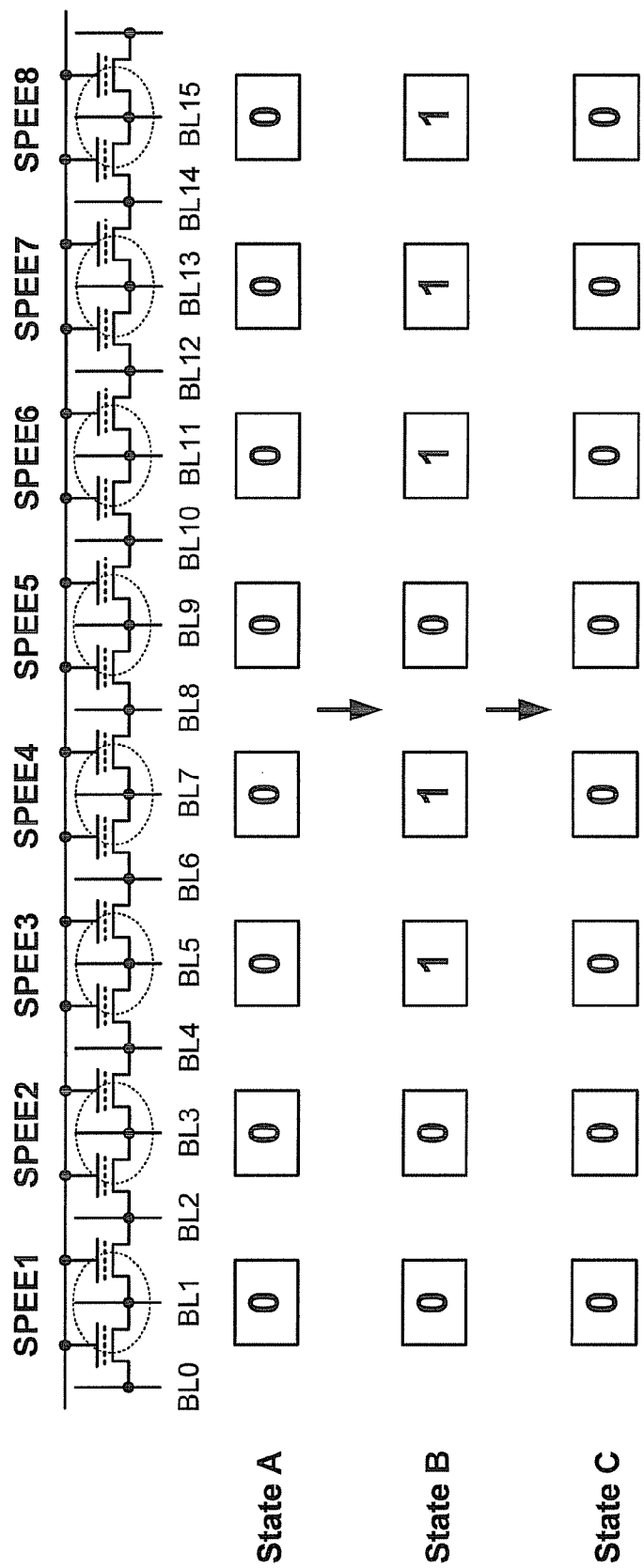
FIG. 21 is a schematic illustration for an exemplary method of programming and erasing single program and erase entities using a high voltage state as an erased state in accordance with one aspect of the specification.

FIG. 21 is a schematic illustration for an exemplary method of programming and erasing single program and erase entities using a high voltage state as an erased state. In this example, single program and erase entities use a high voltage state (e.g., binary value "0") as an erased state and a low voltage state (e.g., logic 1) as a programmed state. All bits of single program and erase entities can be initially binary value "0" or an erased state (State A). Data can be programmed by changing a voltage state of selected single program and erase entities from a high voltage state to a low voltage state. In this example, a hot-hole-injection voltage is applied to SPEE3, SPEE4, SPEE6, SPEE7, and SPEE8, and the data are programmed to "0011 0111" (State B). Then, the programmed single program and erase entities can be erased by applying a hot-electron-injection voltage. In this example, a hot-electron-injection voltage is applied to all the single program and erase entities or SPEE3, SPEE4, SPEE6, SPEE7, and SPEE8, and the data are erased to "0000 0000."

Figure 22A:
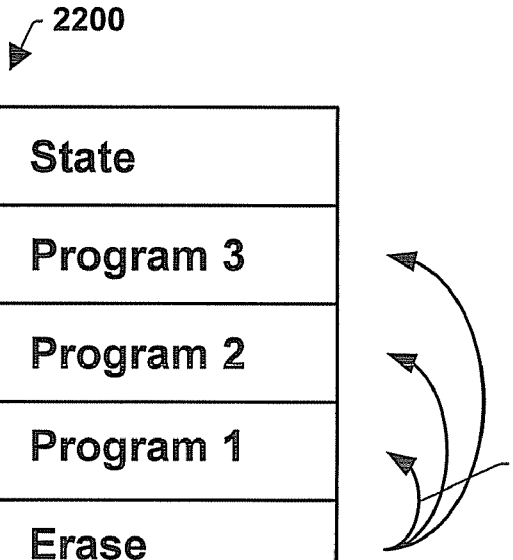
FIG. 22a and 22b illustrate tables depicting exemplary mapping of voltage levels to a two-bit binary value in accordance with one aspect of the specification.
Figure 22B:
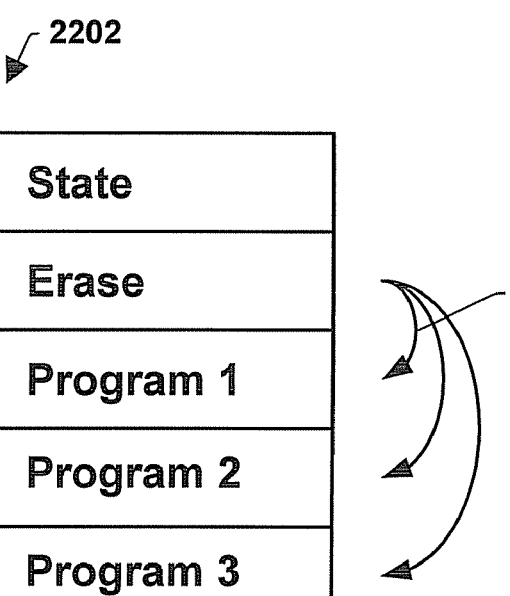

FIGS. 22a and 22b illustrate tables 2200, 2202 depicting mapping of voltage levels to a two-bit binary value. In FIG. 22a, single program and erase entities can have a two-bit binary value when single program and erase entities have four discrete target threshold voltages as described in FIG. 14. Q1 and Q2 represent bit values. In one embodiment, an erases state can be assigned to a binary value "11" and programmed states can be assigned to binary values "10" (e.g., Program 1 state), "01" (e.g., Program 2 state), and "00" (e.g., Program 3 state), which correspond to increasingly larger amounts of stored charge. Arrows in FIG. 22a illustrate state transitions of single program and erase entities. Transition 2204 from level 1 to level 2 represents storing a binary value "10" into single program and erase entities. Referring to FIG. 14, it can be seen that transition 2204 represents a change in the charge distribution of single program and erase entities from region 1402 to region 1404, or an increase in voltage threshold. Although not shown in FIG. 22a, state transitions can be performed from one level to any other level. For example, a state of single program and erase entities is changed from Program 3 state to any other level including Program 2 state, Program 1 state, and Erase state.

In FIG. 22b, an erased state can be assigned to a binary value "00" and programmed states can be assigned to binary values "01" (e.g., Program 1 state), "10" (e.g., Program 2 state), and "11" (e.g., Program 3 state), which correspond to decreasingly less amounts of stored charge. Arrows in FIG.

22b illustrate state transitions of single program and erase entities. Transition 2206 from level 4 to level 3 represents storing a binary value "01" into single program and erase entities. Although not shown in FIG. 22b, state transitions can be performed from one level to any other level. For example, a state of single program and erase entities is changed from Program 3 state to any other level including Program 2 state, Program 1 state, or Erase state.

Figure 23:
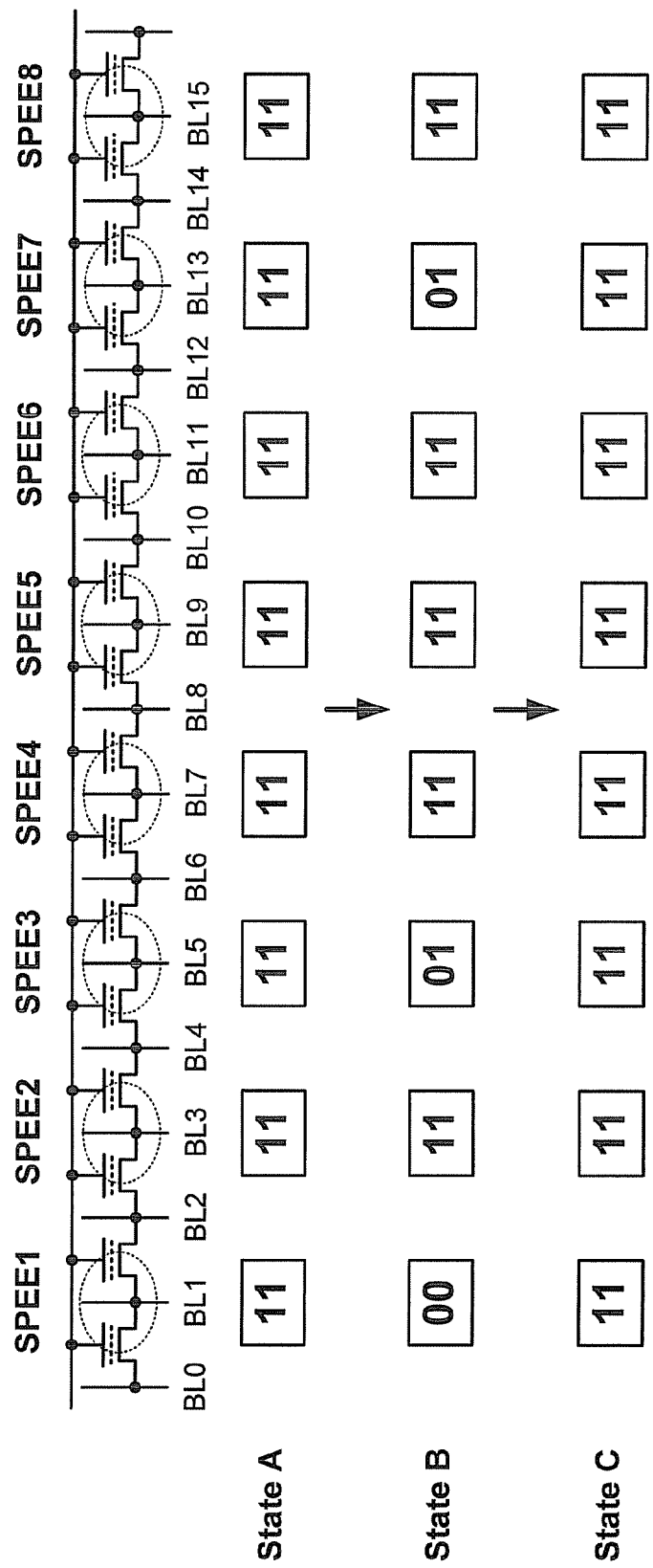
FIG. 23 is a schematic illustration for an exemplary method of programming and erasing single program and erase entities using a low voltage state as an erased state when the single program and erase entities have a two-bit binary value in accordance with one aspect of the specification.

FIG. 23 is a schematic illustration for an exemplary method of programming and erasing single program and erase entities using a low voltage state as an erased state when the single program and erase entities have a two-bit binary value. Single program and erase entities can use a low voltage state (e.g., binary value "11") as an erased state and high voltage states (e.g., binary value "10," "01" and "00") as a programmed state. All bits of single program and erase entities can be initially binary value "11" or an erased state (State A). Data can be programmed by changing a voltage state of selected single program and erase entities from a low voltage state to high voltage states. In this example, hot-electron-injection voltages are applied to SPEE1, SPEE3, and SPEE7, and the data are programmed to "0011 0111 1111 0111" (State B). Then, the programmed single program and erase entities can be erased by applying hot-hole-injection voltages. In this example, hot-hole-injection voltages are applied to all the single program and erase entities, or SPEE1, SPEE3, and SPEE7, and the data are erased to "1111 1111 1111 1111."

Figure 24:
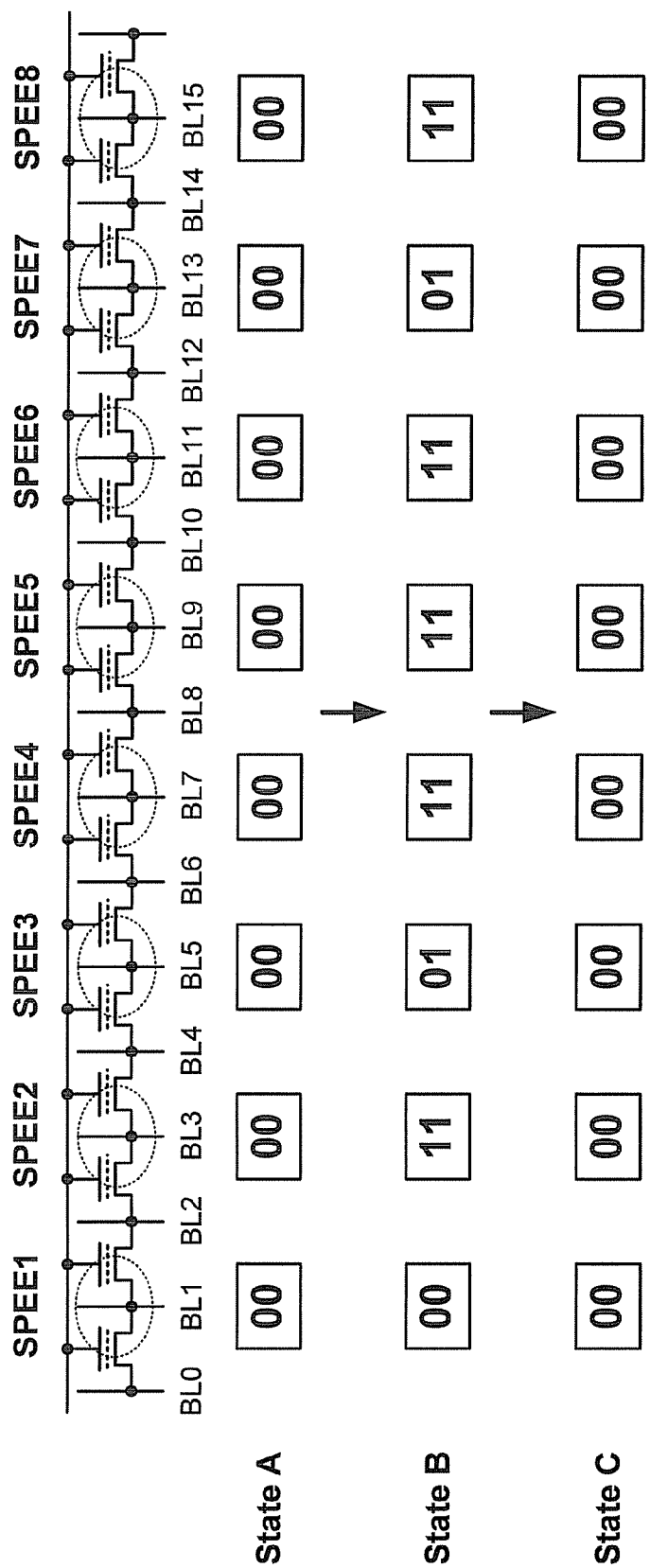
FIG. 24 is a schematic illustration for an exemplary method of programming and erasing single program and erase entities using a high voltage state as an erased state when the single program and erase entities have a two-bit binary value in accordance with one aspect of the specification.

FIG. 24 is a schematic illustration for an exemplary method of programming and erasing single program and erase entities using a high voltage state as an erased state when the single program and erase entities have a two-bit binary value. Single program and erase entities can use a high voltage state (e.g., binary value "00") as an erased state and low voltage states (e.g., binary value "01," "10," and "11") as a programmed state. All bits of single program and erase entities can be initially binary value "00" or an erased state (State A). Data can be programmed by changing a voltage state of selected single program and erase entities from a high voltage state to a low voltage state. In this example, hot-hole-injection voltages are applied to SPEE2, SPEE3, SPEE4, SPEE5, SPEE6, SPEE7, and SPEE8, and the data are programmed to "0011 0111 1111 0111" (State B). Then, the programmed single program and erase entities can be erased by applying hot-electron-injection voltages to all the single program and erase entities or selected single program and erase entities (e.g., SPEE2, SPEE3, SPEE4, SPEE5, SPEE6, SPEE7, and SPEE8), and the data are erased to "0000 0000 0000 0000."

Although not shown, similarly to FIGS. 19-22, single program and erase entities having more than four bit binary values can use a low voltage state as an erased state or a high voltage value as an erased state. Physical memory cells of such single program and erase entities can have n levels of Vt distribution of a charge storage node as described for the Vt distribution 1500 in connection with FIG. 15.

Figure 25:
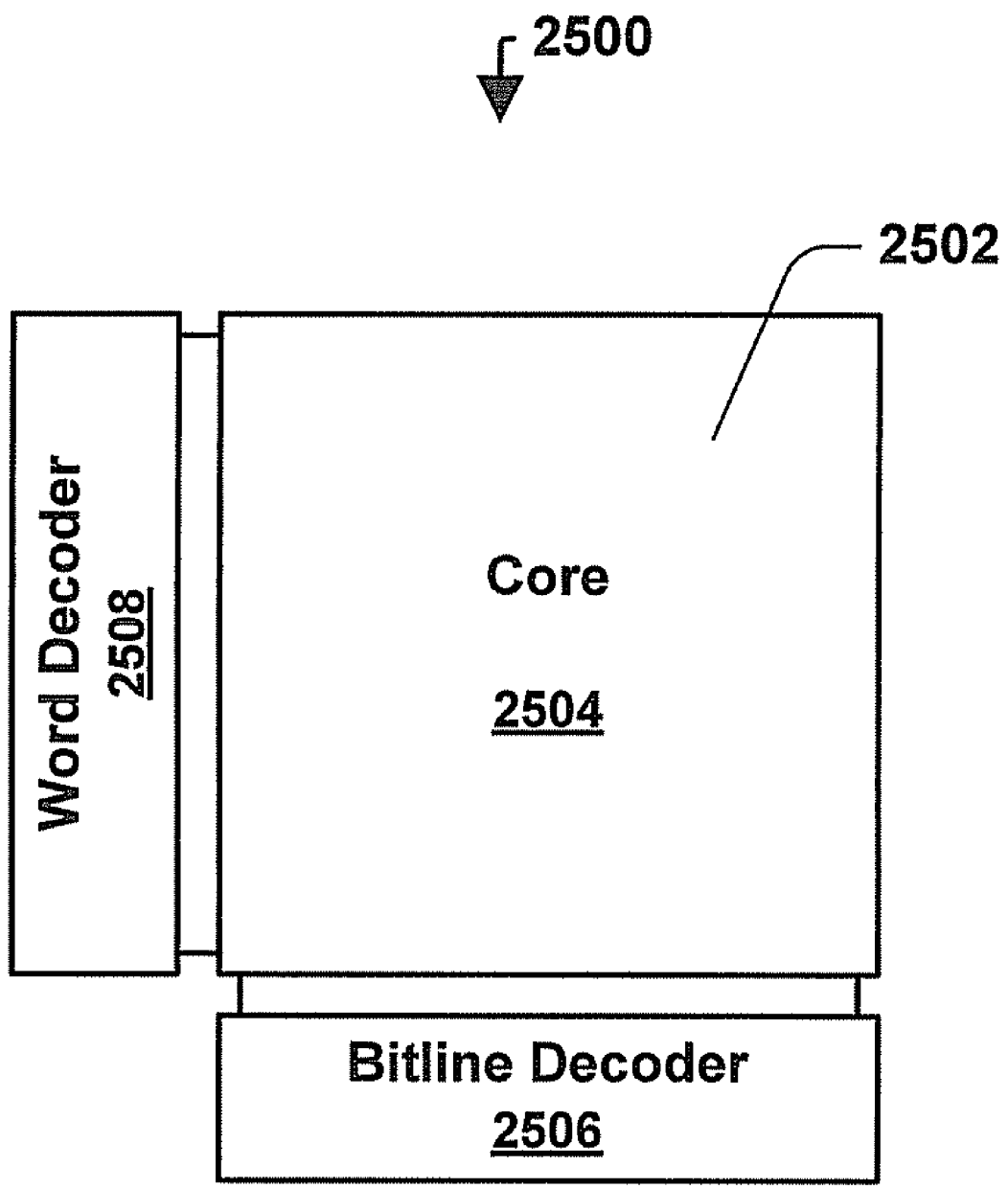
FIG. 25 is a schematic diagram of an exemplary flash device that contains a plurality of single program and erase entities using a high voltage state as an erased state in accordance with one aspect of the specification.

FIG. 25 is a schematic diagram of an exemplary flash device 2500 that contains a plurality of single program and erase entities 2502 using a high voltage state as an erased state. The flash device can contain the plurality of single program and erase entities 2502 in a memory core 2504 and contain one or more decoders 2506, 2508 such as a bitline decoder (e.g., Y decoder or column decoder) and a wordline decoder (e.g., X decoder or row decoder) in the same manner as described for the flash device in connection with FIG. 11.

The decoders 2506, 2508 can select one or more single program and erase entities for erasing a portion of or an entire of the core of the flash device on a basis of the single program and erase entity by changing a voltage state of the single program and erase entity to a high voltage state. In one embodiment, the decoders include one or more bitline decoders that facilitate erasing a portion of or an entire of the flash device on the basis of the single program and erase entity with the proviso that a sector erase is not performed in the portion of or the entire of the core of the flash memory. In another embodiment, the decoders include one or more bitline decoders that facilitate erasing a portion of or an entire of the core of the flash device on the basis of the single program and erase entity with the proviso that an erase pulse is not sequentially applied to two or more consecutive bitlines in the portion of or the entire of the core of the flash memory. In yet another embodiment, the decoders select one or more single program and erase entities with the proviso that the decoders do not select bitlines between the single program and erase entities for applying an erase bitline voltage. In still yet another embodiment, for erasing a portion of or an entire of the core of the flash device on a basis of the single program and erase entity, the decoders select one or more single program and erase entities for applying a hot-electron-injection gate voltage to a gate, applying a hot-electron-injection bitline voltage to a common bitline of the single program and erase entity that is shared by the two adjacent dual bit physical memory cells, and connecting at least one of non-common bitlines of the single program and erase entity that are not shared by the two adjacent dual bit physical memory cells to ground. The memory cells in the memory core can include four or more data states, and the single program and erase entity can contain sixteen or more data states.

Figure 26:
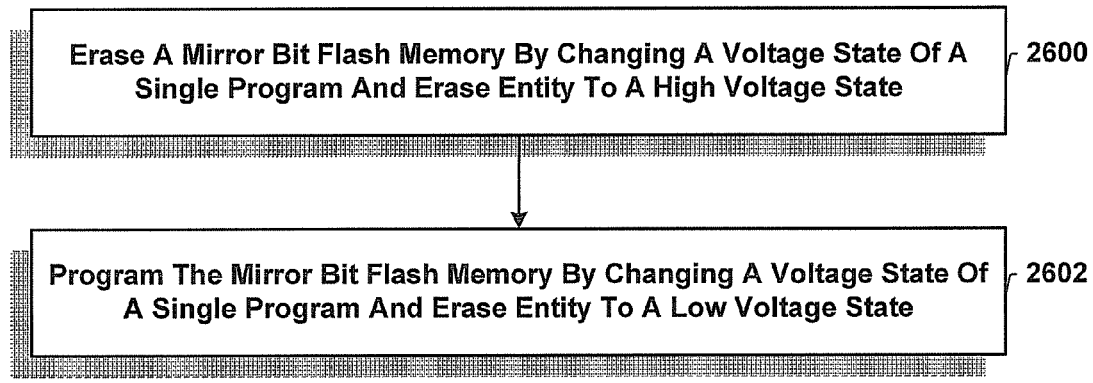
FIG. 26 is a flow diagram of an exemplary methodology for operating a flash device that contains a plurality of single program and erase entities using a high voltage state as an erased state in accordance with one aspect of the specification.

FIG. 26 is a flow diagram of an exemplary methodology for operating a flash device that contains a plurality of single program and erase entities using a high voltage state as an erased state. At 2600, a portion of or an entire of a memory core of a flash device is erased by changing a voltage state of a single program and erase entity to a high voltage state. At 2602, the portion of or the entire of the core of the flash device is programmed by changing a voltage state of the single program and erase entity to a low voltage state. The flash device can be erased and then programmed. In another embodiment, the flash device can be programmed and then erased.

Flash devices, systems, and methods disclosed herein can include an indicator bit that indicates an erase direction of a low voltage state or a high voltage state. When an indicator cell indicates a low voltage state such as an indicator bit "1" or "11," an erase operation can be performed by applying a hot-hole-injection voltage to single program and erase entities or an erase cycle. When there are over-erased single program and erase entities, a soft program cycle can be performed after the erase cycle. In another embodiment, when the indicator cell indicates a high voltage state such as an indicator bit "0" or "00," an erase operation can be performed by applying a hot-electron-injection voltage to single program and erase entities or a pre-program cycle. After a flash device is programmed, the flash device can be erased to either a high voltage state or a low voltage state according to the erase direction indicator bit. As a result, the erase direction indicator bit can reduce erase time and/or reduce a number of cycles (e.g., pre-program cycles, erase cycles, and soft-program cycles), thereby increasing system reliability, efficiency, and or durability.

The erase direction (e.g., a state of an indicator bit) can be changed at any suitable time. When an indicator bit is a low voltage state such as logical "1," single program and erase entities can be programmed by changing their states from a low voltage state (e.g., binary value "1") to a high voltage state (e.g., binary value "0"). Before erasing the data, the indicator bit can be changed from the low voltage state (e.g., binary value "1") to a high voltage state (e.g., binary value "0"). Since the erase indicator bit is now the high voltage state, the single program and erase entities can be erased by changing their states to the high voltage state. In another embodiment, when an indicator bit is a high voltage state (e.g., binary value "0"), single program and erase entities can be programmed by changing their states from a high voltage state (e.g., binary value "0") to a low voltage state (e.g., binary value "1"). Before erasing the data, the indicator bit can be changed from the high voltage state to a low voltage state. Since the erase indicator bit is now the low voltage state, the single program and erase entities can be erased by changing their states to the low voltage state.

Single program and erase entities can be read as erased or programmed by comparing binary values of the single program and erase entities with the indicator bit. When the indicator cell indicates a low voltage state such as an indicator bit "1" or "11," single program and erase entities having the low voltage states can be read as erased and single program and erase entities not having the low voltage state can be read as programmed. When the indicator cell indicates a high voltage state such as an indicator bit "0" or "00," single program and erase entities having the high voltage state can be read as erased and single program and erase entities not having the high voltage state can be read as programmed.

FIG. 27 illustrates a table 2700 for depicting a mapping of an indicator bit to a one-bit binary value. Single program and erase entities can have a one-bit binary value when single program and erase entities have two discrete target threshold voltages as described in FIG. 13. When the indicator cell indicates a low voltage state such as an indicator bit "1," a low voltage state (e.g., binary value "1") is read as erased and a high voltage state (e.g., binary value "0") is read as programmed. When the indicator cell indicates a high voltage state such as an indicator bit "0," a high voltage state (e.g., binary value "0") is read as erased and a low voltage state (e.g., binary value "1") is read as programmed.

Figure 28:
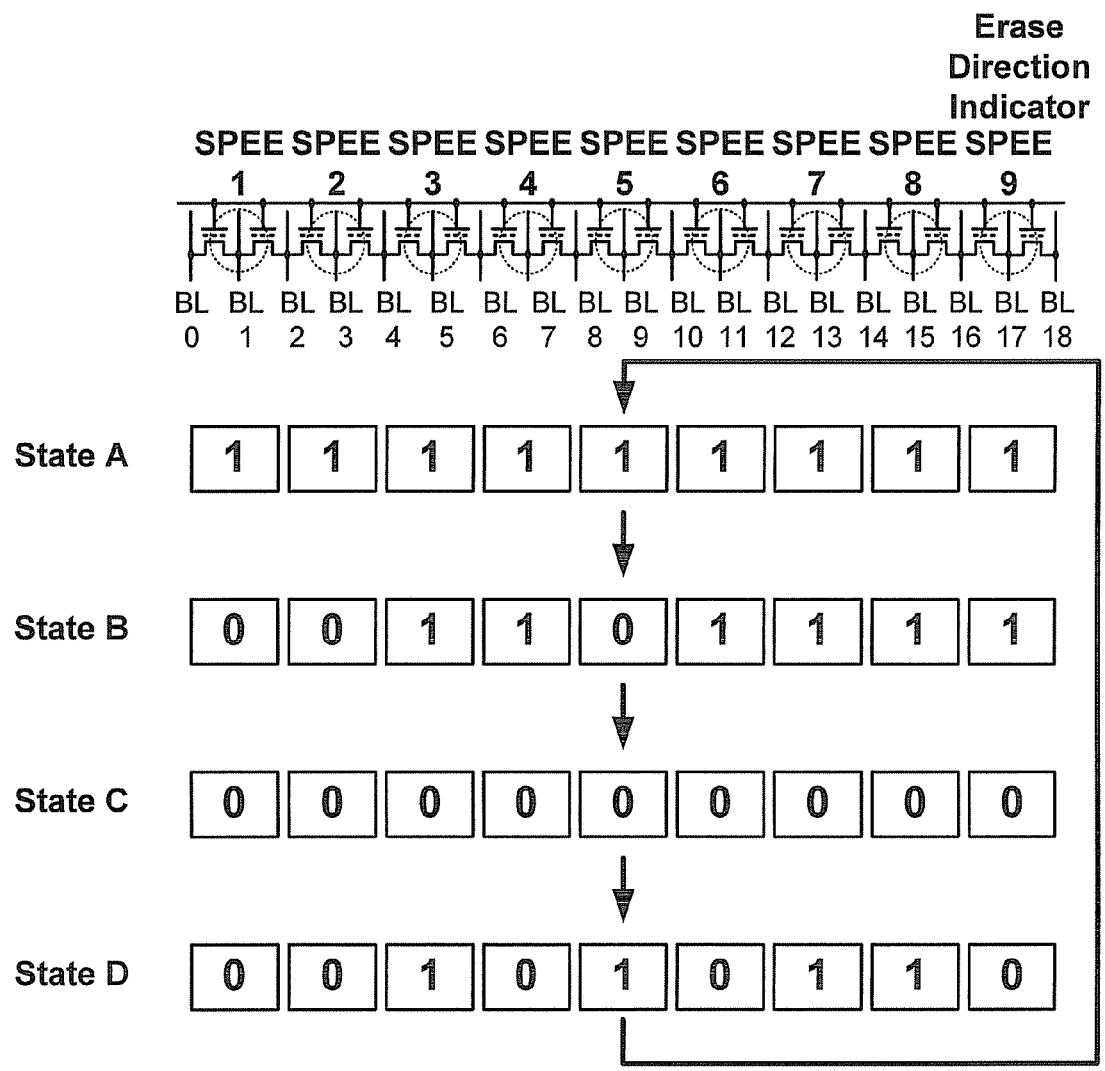
FIG. 28 is a schematic illustration for an exemplary method of programming and erasing single program and erase entities using an erase direction indicator bit in accordance with one aspect of the specification.

FIG. 28 illustrates programming and erasing single program and erase entities using an erase direction indicator bit. In this example, a single program and erase entity 9 (SPEE9) is an erase direction indicator and contain an indicator bit. Initially, an indicator bit of SPEE 9 can be a low voltage state (e.g., binary value "1") and all other bits of single program and erase entities (e.g., SPEEs1-8) can be initially binary value "1" (State A). Thus, SPEEs1-8 are read as erased. Data can be programmed by changing a voltage state of selected single program and erase entities from a low voltage state (e.g., binary value "1") to a high voltage state (e.g., binary value "0"). In this example, hot-electron-injection voltages are applied to SPEE1, SPEE2, and SPEE5, and the data are programmed to "0011 0111" (State B). By comparing the stored bits with the indicator bit "1," binary value "0" of SPEE1, SPEE2, and SPEE5 can be read as programmed. After programming and before erasing SPEEs1-8, the indicator bit can be changed from binary value "1" to binary value "0." As a result, a binary value "0" is now an erased state. An erase operation on single program and erase entities therefore can be performed by changing their states to a high voltage state (e.g., binary value "0") or by applying a hot-electron-injection voltage. In this example, SPEEs1-8 are erased by applying a hot-electron-injection voltage, and the data are erased to "0000 0000" (State C).

Now the indicator bit of SPEE 9 is a binary value "0" and all other bits of single program and erase entities (e.g., SPEEs1-8) are binary value "0" or erased (State C). Thus, data can be programmed by changing a voltage state of selected single program and erase entities from a high voltage state (e.g., binary value "0") to a low voltage state (e.g., binary value "1"). In this example, a hot-hole-injection voltage is applied to SPEE3, SPEE5, SPEE7, and SPEE8, and the data are programmed to "0010 1011" (State D). By comparing the stored bits with the indicator bit "0," binary value "1" of SPEE3, SPEE5, SPEE7, and SPEE8 can be read as programmed. After programming and before erasing SPEEs1-8, the indicator bit can be changed from binary value "0" to binary value "1." As a result, a binary value "1" then indicates an erased state. An erase operation on single program and erase entities therefore can be performed by changing their states to a low voltage state (e.g., binary value "1") or by a applying hot-hole-injection voltage. In this example, SPEEs1-8 are erased by applying a hot-hole-injection voltages to SPEE1, SPEE2, SPEE4, and SPEE6, and the data are erased to "1111 1111" (State A).

Figure 29:
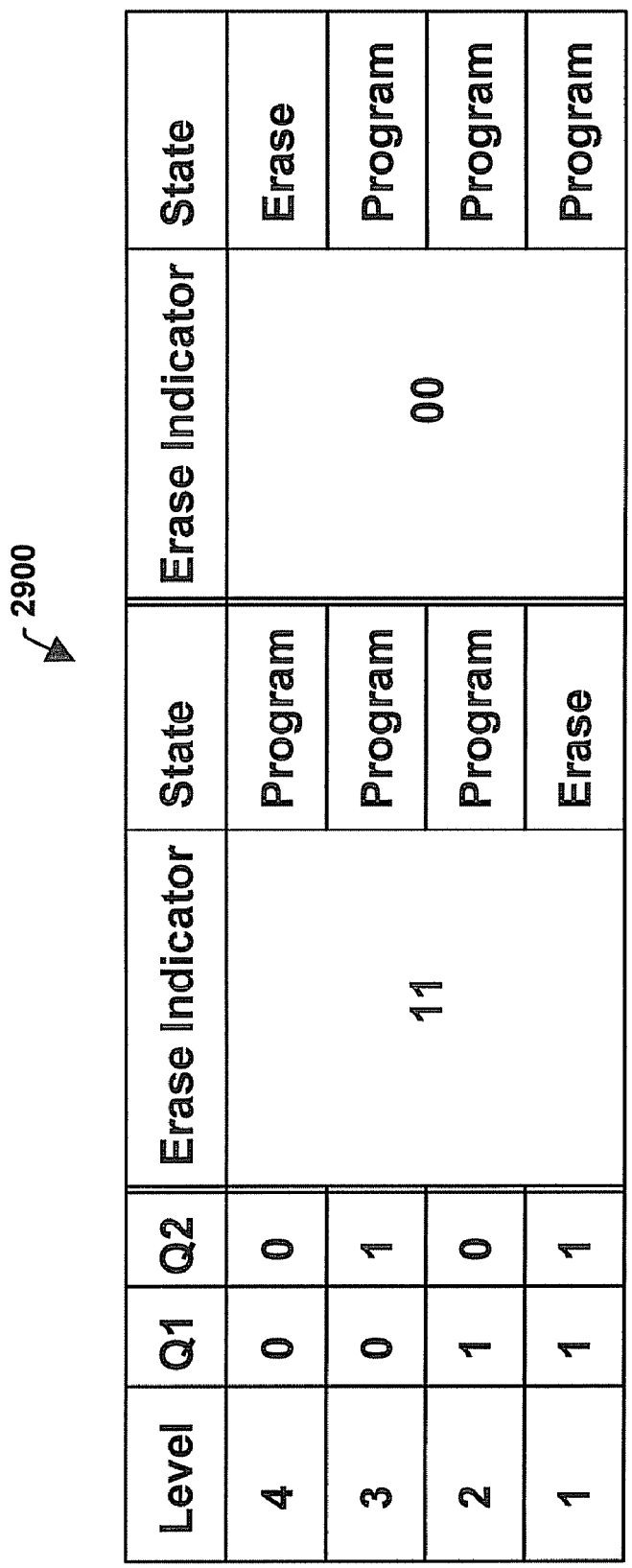
FIG. 29 is a table for depicting an exemplary mapping of an erase direction indicator bit to a two-bit binary value in accordance with one aspect of the specification.

Similarly to FIG. 27, the subject innovation can contain an erase direction indicator bit when single program and erase entities contain two or more binary bit values. By way of example, FIG. 29 illustrates a table 2900 for depicting a mapping of an indicator bit to a two-bit binary value. Single program and erase entities can have a two-bit binary value when single program and erase entities have four discrete target threshold voltages as described in FIG. 14. In this example, when the indicator cell indicates a low voltage state such as a binary value of "11," binary values of "11" stored in single program and erase entities are read as erased and other binary values such as "10," "01," and "00" are read as programmed. When the indicator cell indicates a high voltage state such as a binary value of "00," binary values of "00" stored in single program and erase entities are read as erased and other binary values such as "01," "10," and "11" are read as programmed.

Figure 30:
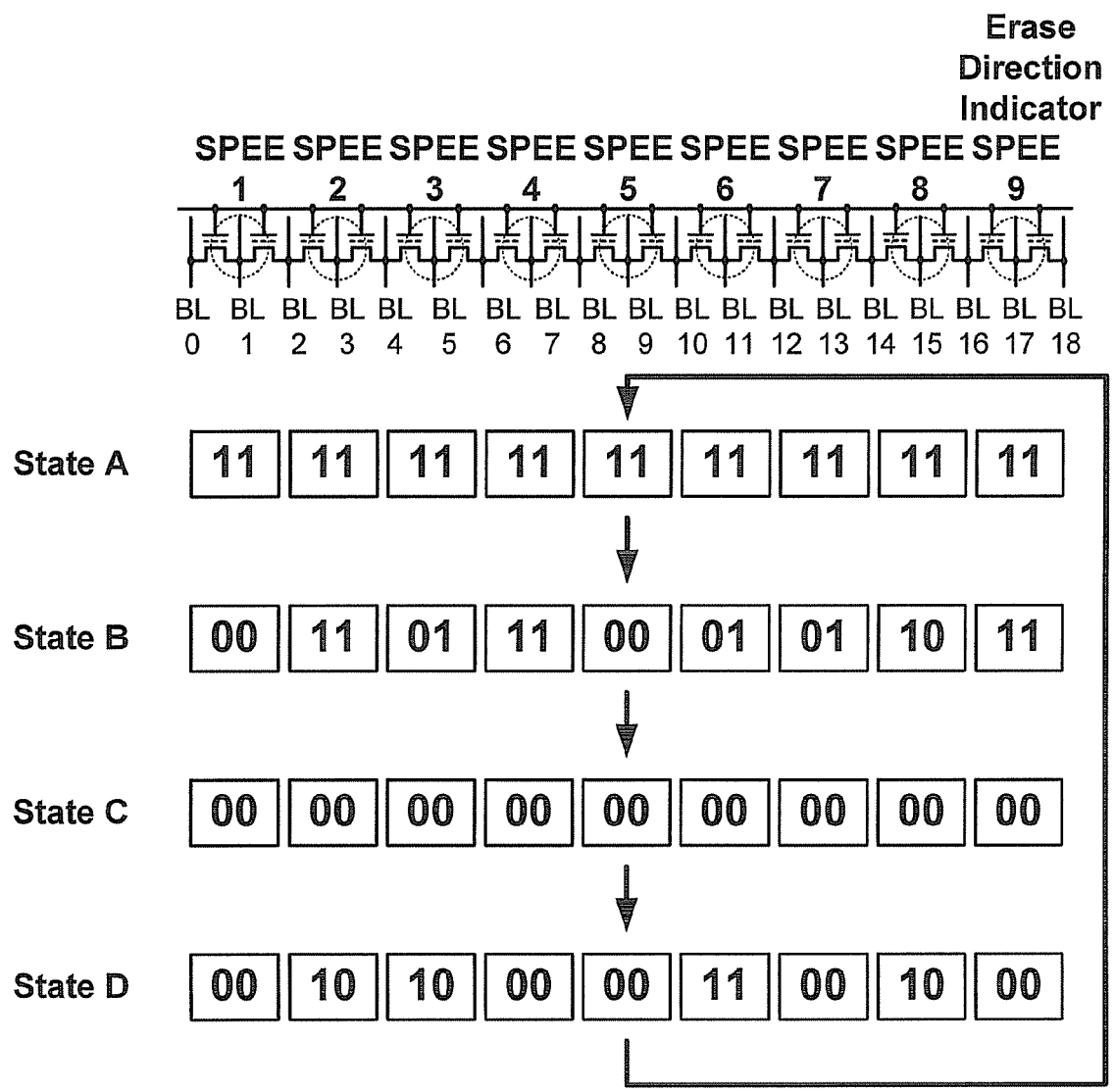
FIG. 30 is a schematic illustration for another exemplary method of programming and erasing single program and erase entities using an erase direction indicator bit in accordance with one aspect of the specification.

FIG. 30 illustrates programming and erasing single program and erase entities using an erase direction indicator bit when single program and erase entities contain two binary bit values. In this example, a single program and erase entity 9 (SPEE9) is an erase direction indicator and contains an indicator bit. Initially, an indicator bit of SPEE 9 can be binary value "11" and all other bits of single program and erase entities (e.g., SPEEs1-8) can be initially binary value "11" (State A). Thus, SPEEs1-8 are read as erased. Next, in this example, a hot-electron-injection voltage is applied to SPEE1, SPEE3, SPEE5, SPEE 6, SPEE 7, and SPEE 8, and the data are programmed to "0011 0111 0001 0110" (State B). After programming and before erasing SPEEs1-8, the indicator bit can be changed from a binary value of "11" to a binary value "00." As a result, a binary value "00" now indicates an erased state. In this example, with an erasing operation, SPEEs1-8 are erased by applying a hot-electron-injection voltage to SPEE2, SPEE3, SPEE4, SPEE 6, SPEE 7, and SPEE 8, and the data are erased to "0000 0000 0000 0000" (State C).

Now the indicator bit of SPEE 9 is binary value "00" and all other bits of single program and erase entities (e.g., SPEEs1-8) are binary value "00" or erased (State C). On a next program operation, a hot-hole-injection voltage is applied to SPEE2, SPEE3, SPEE6, and SPEE8, and the data are programmed to "0010 1000 0011 0010" (State D). After programming and before erasing SPEEs1-8, the indicator bit can be changed from a binary value "00" to a binary value "11." As a result, a binary value "11" is then an erased state. An erase operation on single program and erase entities therefore can be performed by changing their states to a binary value "11" or by applying hot-hole-injection voltages. In this example, a hot-hole-injection voltage is applied to SPEE1, SPEE2, SPEE3, SPEE4, SPEE5, SPEE7 and SPEE8, and the data are erased to "1111 1111 1111 1111" (State A). At any suitable time between the program operations and the erase operations, the stored data can be read by comparing the stored bits with the indicator bit.

Figure 31:
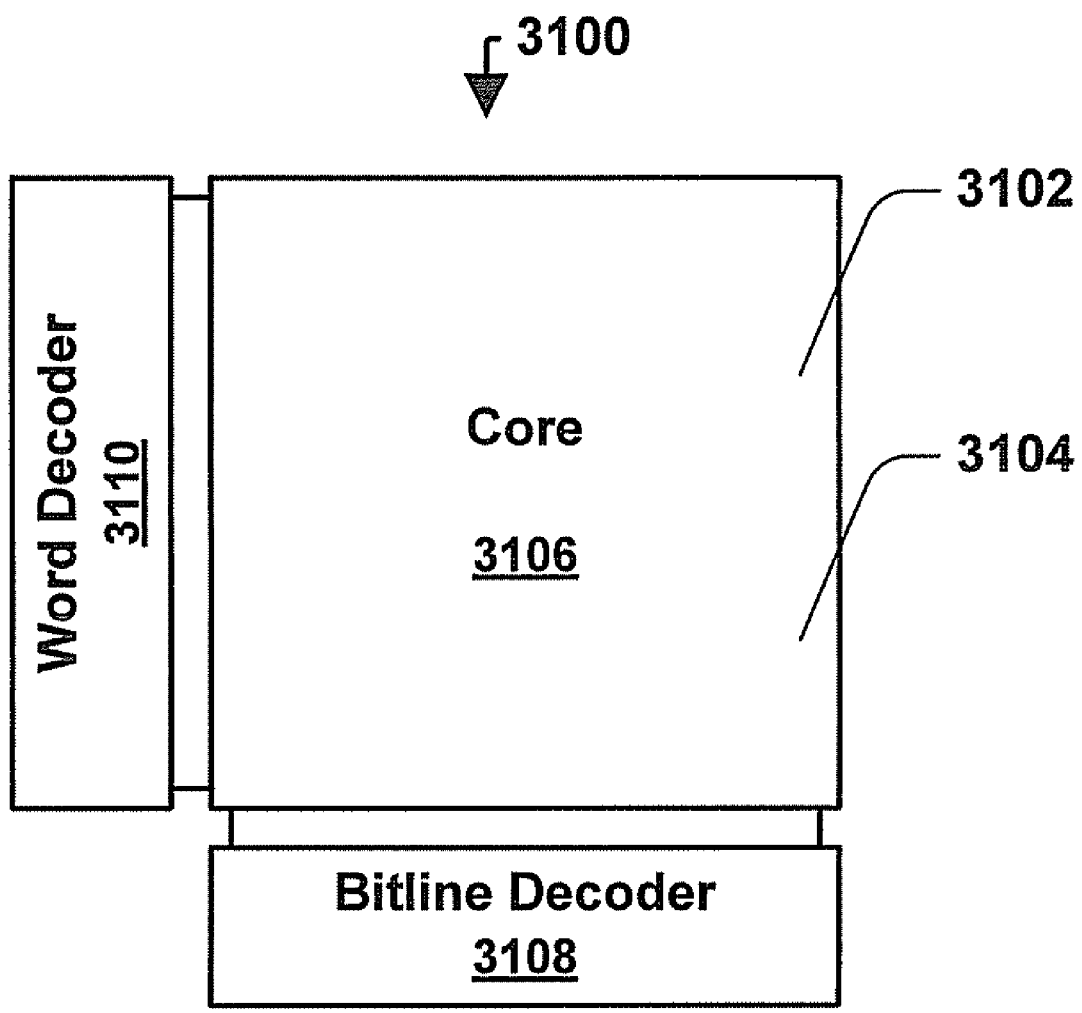
FIG. 31 is a schematic diagram of an exemplary flash device that contains a plurality of single program and erase entities and an erase direction indicator cell in accordance with one aspect of the specification.

FIG. 31 is a schematic diagram of an exemplary flash device 3100 that contains a plurality of single program and erase entities 3102 and an indicator cell 3104 in a memory core 3106. The flash device can contain the plurality of single program and erase entities and one or more decoders 3108, 3110 in the same manner as described for the flash memory 1100 in connection with FIG. 11. The indicator cell 3104 can contain an indicator bit as an erase direction of a low voltage state or a high voltage state. The indicator cell can be a single program and erase entity. The indicator cell can be programmed to indicate the low voltage state or the high voltage state as erase state. The indicator cell can exist at any suitable place. For example, the indicator cell is in the same memory core containing the single program and erase entities, as described in FIG. 31. When the indicator cell is in a row of single program and erase entities, the indicator cell can control an erase state of single program and erase entities in that row. Although not shown in FIG. 31, in another embodiment, the indicator cell exists in a core that is different from a core that contains a plurality of single program and erase entities.

The decoders 3108, 3110 can select one or more single program and erase entities for operating the flash device on a basis of the single program and erase entity by changing a voltage state of a single program and erase entity to a low voltage state or a high voltage state according to the erase direction. In one embodiment, the decoders select one or more single program and erase entities for erasing the flash device by applying a hot-hole-injection voltage to the single program and erase entity when the indicator cell indicates a low voltage state or by applying a hot-electron-injection voltage to the single program and erase entity when the indicator cell indicates a high voltage state. In another embodiment, the decoders select one or more single program and erase entities for programming the flash device by applying a hot election injection voltage to the single program and erase entity when the indicator cell indicates a low voltage state or by applying a hot-hole-injection voltage to the single program and erase entity when the indicator cell indicates a high voltage state. In yet another embodiment, after the indicator cell indicates a first erase direction and any operation of the flash device (e.g., erasing, programming, and/or reading) is performed with the first erase direction, the indicator cell indicates a second erase direction that is opposite to the first erase direction, and another operation of the flash device is performed with the second erase direction.

Figure 32:
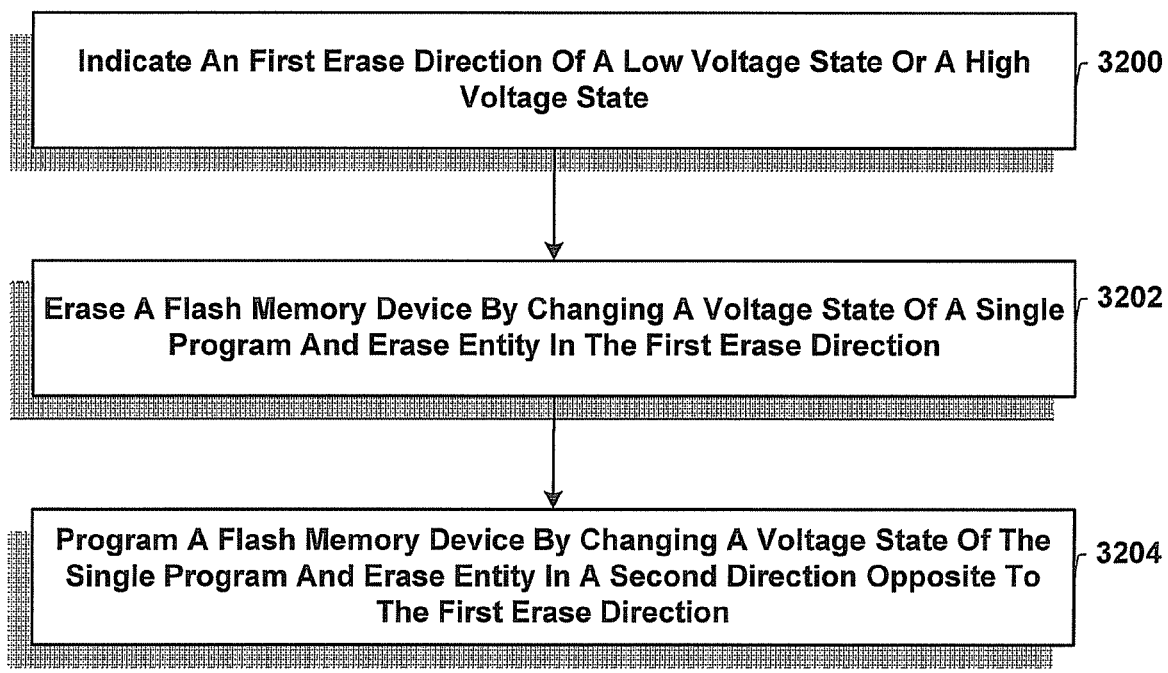
FIG. 32 is a flow diagram of an exemplary methodology for operating a flash device that contains a plurality of single program and erase entities using an erase direction indicator in accordance with one aspect of the specification.

FIG. 32 is a flow diagram of an exemplary methodology for operating a flash device that contains a plurality of single program and erase entities using an erase direction. At 3200, a first erase direction of a low voltage state or a high voltage state can be indicated. At 3202, a flash memory device can be erased by changing a voltage state of a single program and erase entity in the first erase direction. At 3204, the flash memory device can be programmed by changing a voltage state of the single program and erase entity in a second direction opposite to the first erase direction. In one embodiment, the flash memory device is read by comparing the voltage state of the single program and erase entity with the erase direction. An erase operation, a program operation, a read operation, or combinations thereof can be performed in any suitable order and any suitable number of times. For example, a first erase direction is indicated and an erase operation and a program operation are performed. And then, a second erase direction is indicated and another erase operation and program operation are performed.

Figure 33:
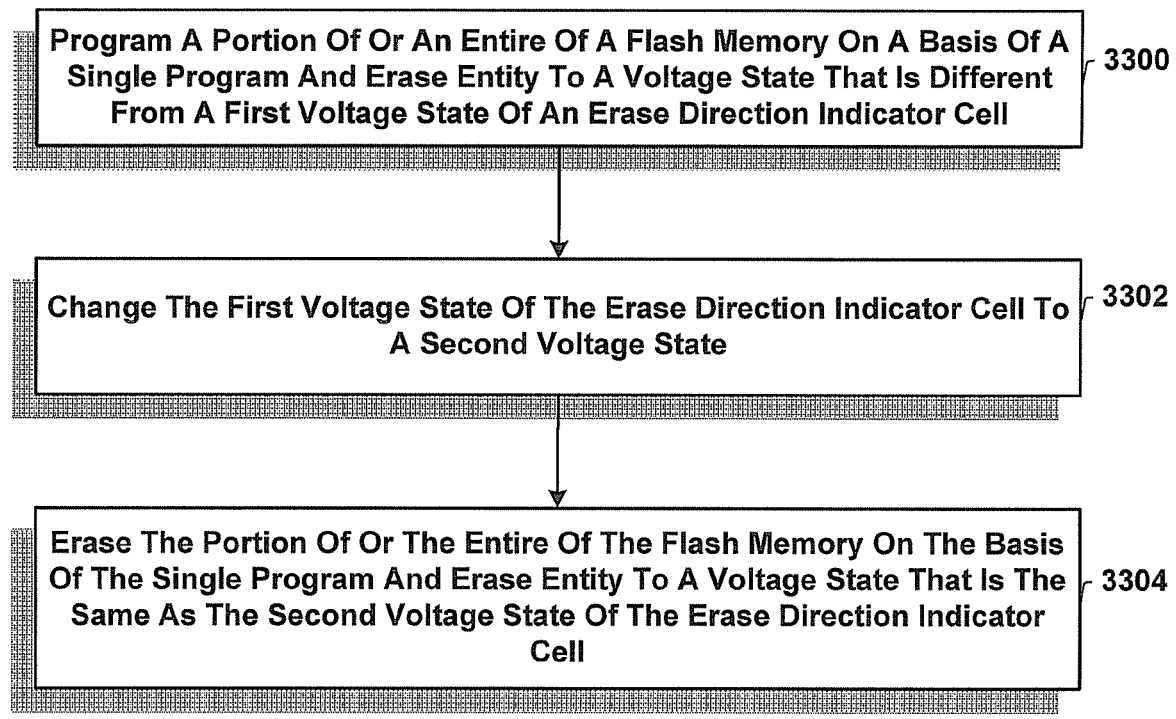
FIG. 33 is a flow diagram of another exemplary methodology for operating a flash device that contains a plurality of single program and erase entities using an erase direction indicator in accordance with one aspect of the specification.

FIG. 33 is a flow diagram of another exemplary methodology for operating a flash device that contains a plurality of single program and erase entities using an erase direction. At 3300, a portion of or an entire of the flash memory is programmed on a basis of a single program and erase entity to a voltage state that is different from a first voltage state of an erase direction indicator cell. At 3302, the first voltage state of the erase direction indicator cell is changed to a second voltage state. At 3304, the portion of or the entire of the flash memory is erased on the basis of the single program and erase entity to a voltage state that is the same as the second voltage state of the erase direction indicator cell. Erasing the portion of or the entire of the flash memory on the basis of the single program and erase entity can involve neutralizing a charge in the single program and erase entity when the erase direction indicator cell indicates a low voltage state as an erased state, or trapping a charge in the single program and erase entity when the erase direction indicator cell indicates a high voltage state as an erased state. The method can further involve programming the portion of or the entire of the flash memory on the basis of the single program and erase entity to a voltage state that is different from a second voltage state of the erase direction indicator cell.

Figure 34:
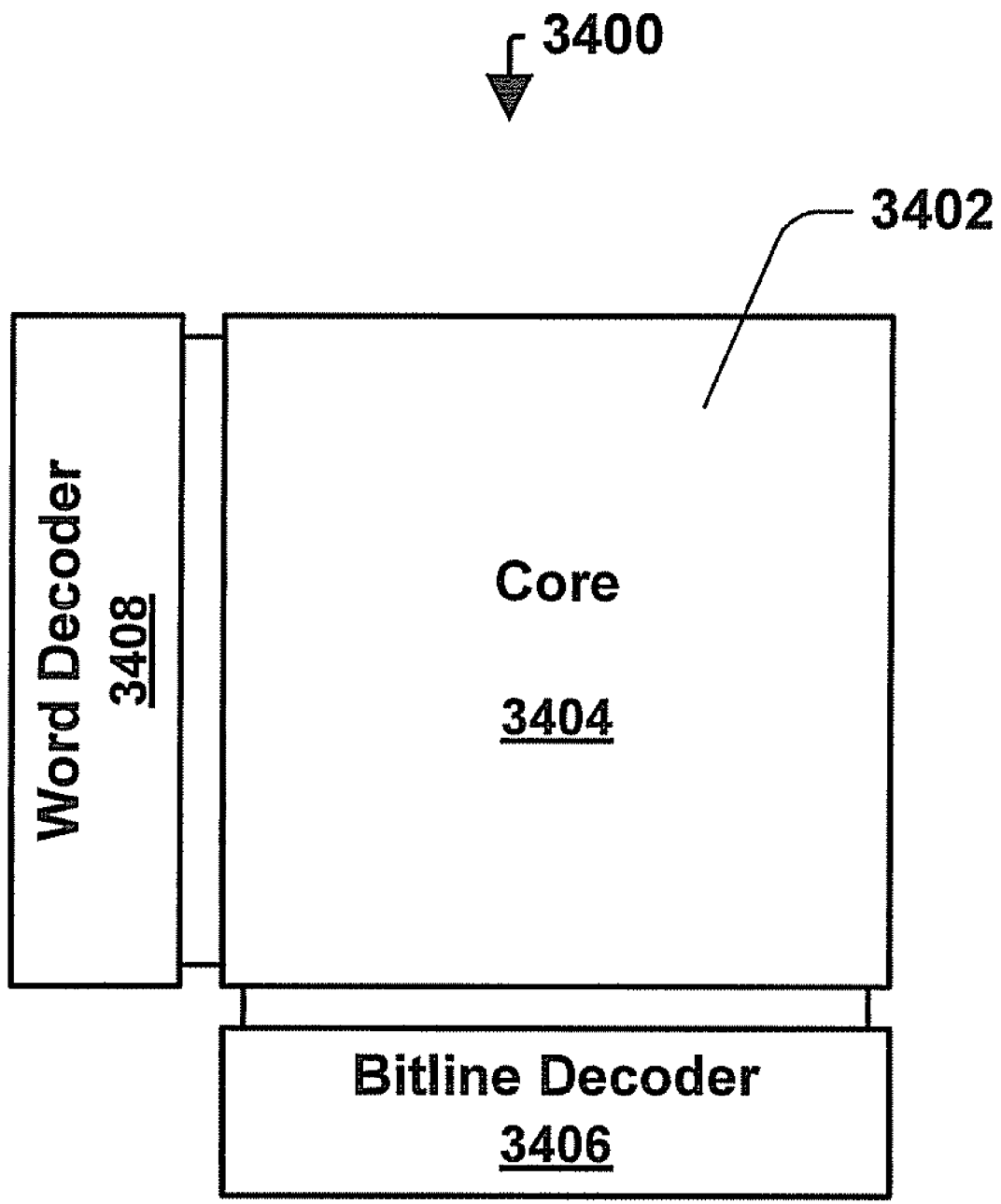
FIG. 34 is a schematic diagram of an exemplary flash device that emulates byte alterability in the flash device using single program and erase entities in accordance with one aspect of the specification.

FIG. 34 illustrates another exemplary flash device 3400 that emulates an EEPROM features or functionalities (e.g., byte alterability) in a flash device using single program and erase entities 3402. The flash device can contain a plurality of single program and erase entities 3402 in a core 3404 and one or more decoders such as a bitline decoder (e.g., Y decoder or column decoder) 3406 and a wordline decoder (e.g., X decoder or row decoder) 3408 in the same manner as described for the flash device 1100 in connection with FIG. 11.

For emulating EEPROM in a flash device, any suitable decoder (e.g., Y decoder, bitline decoder, or column decoder, and X decoder, wordline decoder, or row decoder) can be employed as long as the decoder can select one or more single program and erase entities for access. While emulating EEPROM in a flash memory, the decoders do not need to operate a sector erase.

The decoders can select one or more single program and erase entities in response to received addresses. The bitline decoder can select one or more columns and the wordline decoder can select one or more rows. The decoders can select one or more addresses by any suitable technique. In one embodiment, a table (e.g., a lookup table) is employed to implement decoders (e.g., bitline decoders). The table can drive a register-transfer-level (RTL) description to implement decoders (e.g., bitline decoders). The bitline decoders can include a table-driven decoder.

Figure 35:
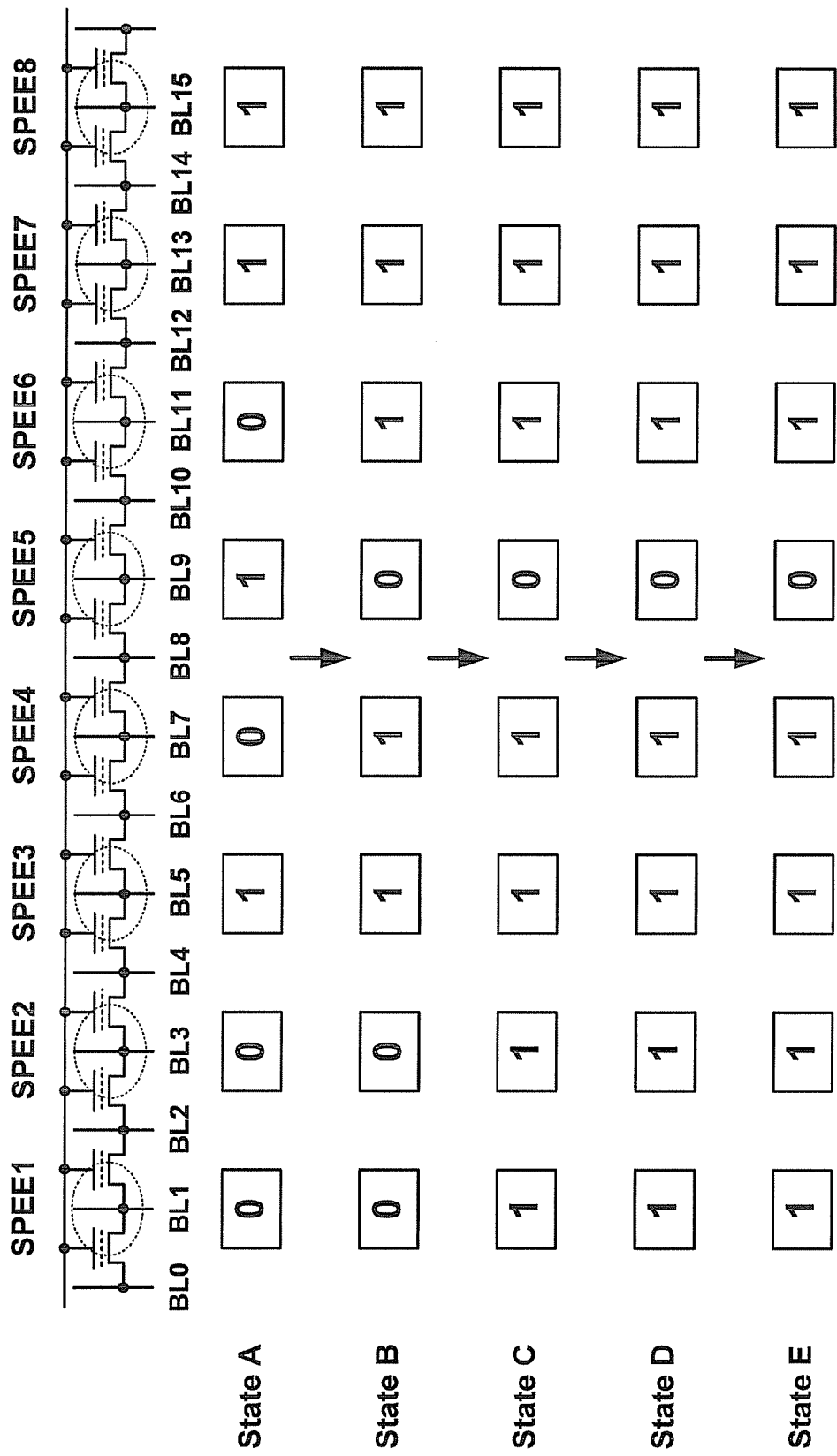
FIG. 35 is a schematic illustration for an exemplary method of emulating byte alterability in a flash device using single program and erase entities in accordance with one aspect of the specification.

FIG. 35 is a schematic illustration for an exemplary method of emulating byte alterability in a flash device using single program and erase entities. As disclosed in connection with FIGS. 17 and 18, the subject innovation can allow changing a voltage state of a single program and erase entity on a basis of a single program and erase entity, not a sector basis. Since the high voltage state and low voltage state in a single program and erase entity can be changed alternately (e.g., programmed or erased) without a sector erase, the subject innovation can emulate byte alterability (e.g., EEPROM byte alterability) in a flash device.

By way of illustration, in FIG. 35, single program and erase entities use a high voltage state (e.g., binary value "0") as an erased state and a low voltage state (e.g., binary value "1") as a programmed state. A row of single program and erase entities (SPEEs1-8) can contain data "0010 1011" (State A). The data can be re-written to "0011 0111" (State B). The data can be a user data. The data of State B can be re-programmed to "1111 0111" (State C), which can be in a program data phase. Then, the data of State C can be re-written to an erase data phase "1111 0111" (State D). Finally, the data of State D can be re-written to a final data such as a user data "0011 0111" (State E).

Although not shown in FIG. 35, charge storage nodes of single program and erase entities can have any suitable number of levels as described in connection with FIGS. 13, 14, and 15. For example, the single program and erase entities can be programmed to four levels as described in connection with FIG. 14. This can facilitate emulating byte alterability using four-bits-per-entity.

Figure 36:
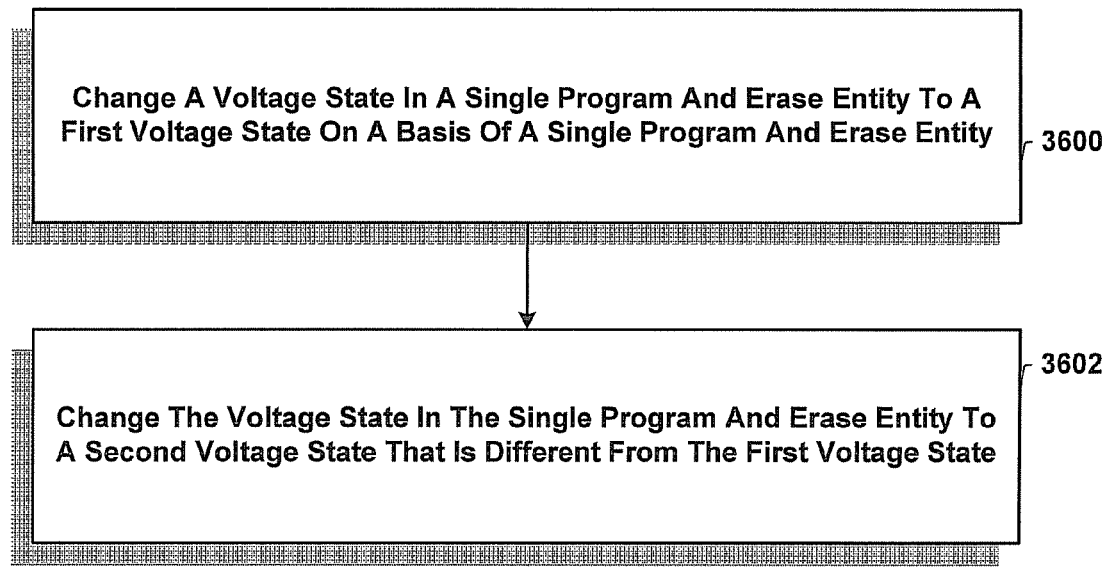
FIG. 36 is a flow diagram of an exemplary methodology for emulating byte alterability in a flash device using single program and erase entities in accordance with one aspect of the specification.

FIG. 36 is a flow diagram of an exemplary methodology of emulating byte alterability using a flash device based on a single program and erase entity. The method can be used as EEPROM emulation. At 3600, a voltage state in a single program and erase entity can be changed to a first voltage state (e.g., a high voltage state or a low voltage state) on a basis of a single program and erase entity. At 3602, the voltage state in the single program and erase entity can be changed to a second voltage state that is different from the first voltage state. Although not shown in FIG. 36, the voltage state in the single program and erase entity can be change by applying a hot-electron-injection voltage or a hot-hole-injection voltage to a portion of or an entire of the flash memory on the basis of the single program and erase entity.

The single program and erase entity includes two adjacent dual bit physical memory cells of the flash device as a single logical cell. Thus, in one embodiment, the voltage state in the single program and erase entity can be changed to a high voltage state or a low voltage by applying a hot-electron-injection gate voltage to a gate, applying a hot-electron-injection bitline voltage to a common bitline of the single program and erase entity that is shared by the two adjacent dual bit physical memory cells, and connecting non-common bitlines of the single program and erase entity that are not shared by the two adjacent dual bit physical memory cells to ground, or applying a hot-hole-injection gate voltage to a gate, applying a hot-electron-injection bitline voltage to a common bitline of the single program and erase entity that is shared by the two adjacent dual bit physical memory cells, and allowing non-common bitlines of the single program and erase entity that are not shared by the two adjacent dual bit physical memory cells to float. In another embodiment, the methodology in FIG. 36 further involves erasing the flash device by changing the voltage state to a predetermined voltage state on the basis of the single program and erase entity. For example, prior to programming a flash device and/or after programming a flash device, the flash device can be erased on the basis of the single program and erase entity to a predetermined voltage state. The flash device can be erased by applying an erase pulse to a portion of or an entire of the flash memory on the basis of the single program and erase entity.

Figure 37:
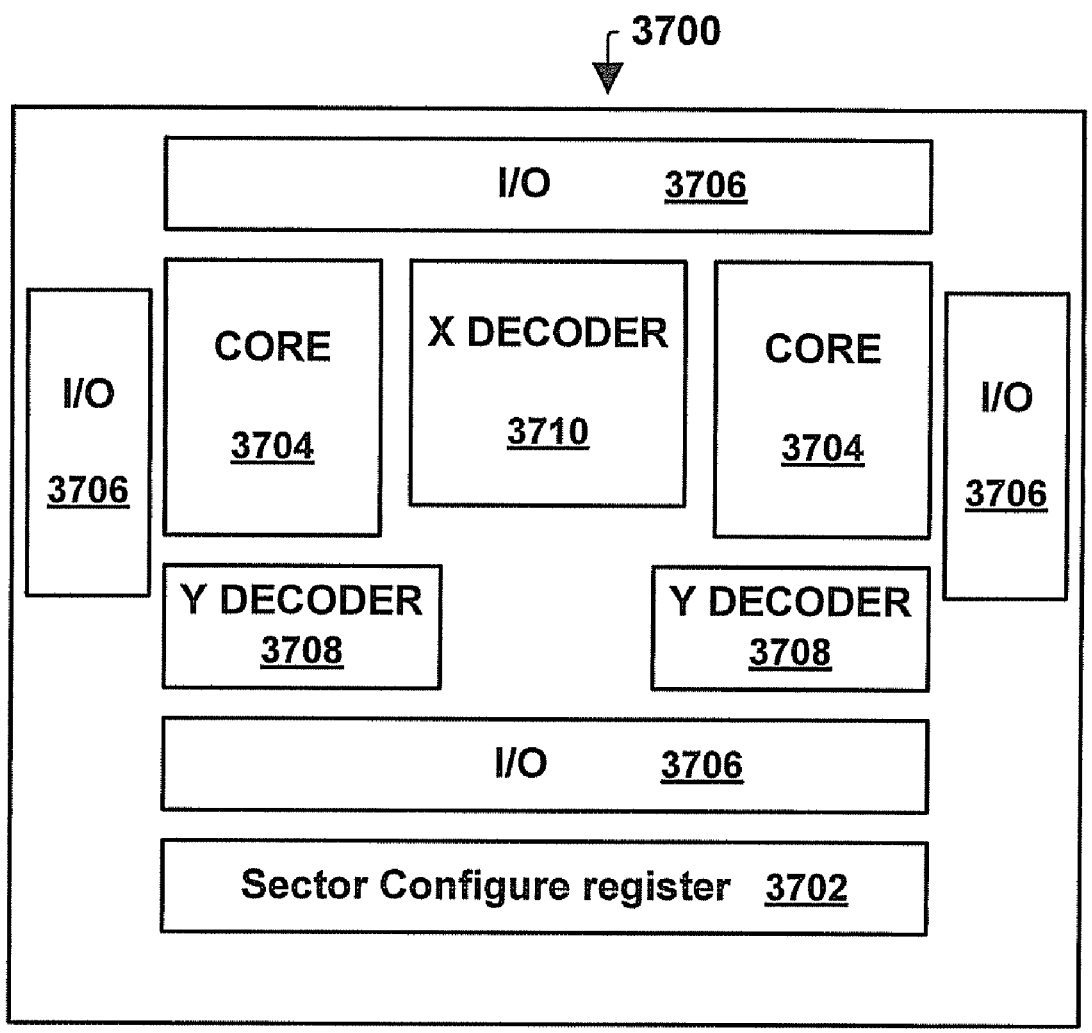
FIG. 37 is a top view of another exemplary dual bit flash device in accordance with one aspect of the specification.

FIG. 37 is a top view of another exemplary flash device 3700 containing sector configure resisters 3702. The memory device 3700 includes one or more memory cores (e.g., memory cell arrays) 3704, one or more sector configure resisters 3702, one or more input/output (I/O) registers 3706, one or more bitline decoders 3708, and one or more wordline decoders 3710. The memory cell array 3704 includes a plurality of memory cells arranged in an ordered array of rows and columns in the same manner as described for the memory core 104 in connection with FIG. 1.

A flash device can include a combination of two different storage schemes or methodologies using one or more sector configure registers. The combination can share the same support logic in a flash device. In one embodiment, a flash device contains a combination of a conventional dual bit decoding scheme with a single program and erase entity decoding scheme. The conventional dual bit decoding scheme can be employed in a dual bit memory device for high density storage. The single program and erase entity decoding scheme can be employed for emulating EEPROM functionality in a flash device, as described in connection with FIGS. 34-36. Thus, the combination of the dual bit decoding scheme and the single program and erase entity decoding scheme can provide both dual bit high density storage and EEPROM emulation in a single flash device.

The single program and erase entity decoding scheme employs a single program and erase entity as a single logical cell. In the single program and erase entity decoding scheme, the single program and erase entities are programmed and erased to a high voltage state or a low voltage state as a single logical cell. The dual bit decoding scheme is a conventional decoding scheme employed for storing data in a conventional flash device. Details of the conventional dual bit decoding scheme are not critical to the subject innovation. The details of the conventional dual bit decoding scheme can be found in, for example, commonly-assigned U.S. Pat. No. 7,130,210 issued Oct. 31, 2006, which is hereby incorporated by reference. In the dual bit decoding scheme, the dual bit memory cells are typically programmed to a high voltage state and are erased to a low voltage state on a sector basis.

The memory core 3704 of the flash device 3700 can contain two regions for the two decoding schemes. Each region can contain one or more sectors, independently. A first region of the memory core can be selected for the single program and erase entity decoding scheme (e.g., EEPROM emulation), and a second region of the memory core can be selected for the dual bit decoding scheme (e.g., conventional storage). Selection from the conventional storage and the EEPROM emulation in a flash memory can be achieved by using one or more sector configure resisters 3702. The sector configure resister can store data related to selection of virtual ground mapping of the memory array. The configure registers form register means for storing selection information or data. For example, the sector configure registers store performance variable data for operating the first region on the basis of the single program and erase entity and/or performance variable data for operating the second region in the dual bit decoding scheme.

Selection information and data stored in the sector configure registers 3702 can be provided to the memory device 3700 using the I/O register 3706. Contents of the sector configure register 3702 can serve as inputs to a state machine (not shown) which controls various operations (e.g., read, erase and programming) of the memory device 3700. The state machine can perform embedded operations based on the input from the sector configure register 3702 to complete reading, erasing and programming automatically without user interaction.

In the first region performing EEPROM emulation functionality, various operations can be performed on a byte or variable length basis. As described above, single program and erase entities can be operated on a byte or variable length basis. For example, program and erase operations can be performed on a byte or variable length basis. In the second region performing dual bit storage functionality, erase operations and/or program operations are typically performed on a sector or block basis. A block can be any suitable size, such as 16 rows by 256 words per row.

Sector configure registers 3702 can include any suitable register, data storage circuit, or the like. In one embodiment, the sector configure registers are delay registers or D-type flip flops. In another embodiment, any suitable data storage circuit can be fashioned to provide the functionality of the sector configure registers. For example, a master-slave flip flop can be substituted, or the sector configure registers can be provided with other operational features such as hardware set. In yet another embodiment, the sector configure registers are combined with combinatorial logic, timing or clocking signals, or stored data to provide added flexibility.

The flash device 3700 can contain one or more first decoders for the first region and one or more second decoders for the second region. The first decoders can select one or more single program and erase entities in the first region for operating the single program and erase entities in accordance with the single program and erase entity decoding scheme. The second decoders can select one or more dual bit memory cells for performing, for example, a sector erase, in accordance with the dual bit decoding scheme. The first and second decoders can be any suitable decoder. For example, the first decoders are any of the decoders as described above in connection with FIG. 25.

Figure 38:
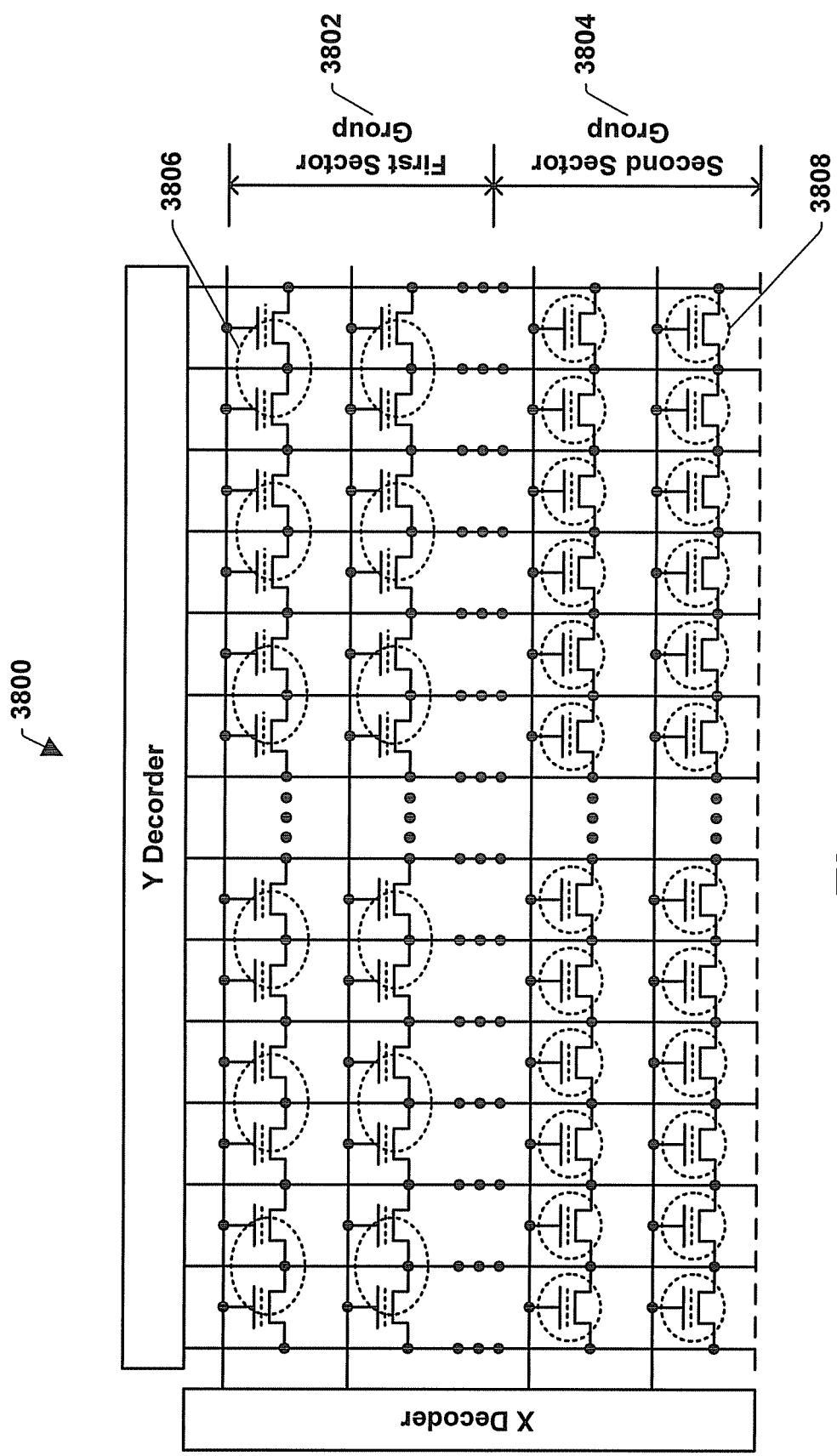
FIG. 38 is a schematic illustration a portion of a flash memory core containing multiple virtual ground decoding schemes in accordance with one aspect of the specification.

FIG. 38 is a schematic illustration a portion of a memory core 3800 containing multiple virtual ground decoding schemes (e.g., First Sector Group 3802 and Second Sector Group 3804). In this embodiment, the memory core 3800 contains two ground decoding schemes of a single program and erase entity decoding scheme in the first sector group 3802 and a conventional dual bit decoding scheme in the second sector group 3804.

In the first sector group 3802, various operations can be performed on a basis of the single program and erase entity on a single bit or variable bit length basis. As disclosed above, in the single program and erase entity decoding scheme, the single program and erase entities can be operated (e.g., program, erase, and read) as a single logical cell. In the second sector group 3804, physical memory cells 3808 are used for various operations as a single logical cell. Erase operations and/or program operations are typically performed on a sector or block basis in the second sector group.

Each of the two sector groups 3802, 3804 can contain one or more sectors. The memory core 3800 can contain any suitable number of sectors for the conventional dual bit decoding scheme and for the single program and erase entity decoding scheme. In one embodiment, about 1% of sectors or more and about 100% of sectors or less in a memory core are associated with a dual bit decoding scheme and about 0% of sectors or more and about 99% of sectors are associated with single program and erase entity decoding scheme. In another embodiment, about 2% of sectors or more and about 90% of sectors or less in a memory core are associated with a dual bit decoding scheme and about 10% of sectors or more and about 98% of sectors are associated with single program and erase entity decoding scheme. In yet another embodiment, about 5% of sectors or more and about 80% of sectors or less in a memory core are associated with a dual bit decoding scheme and about 20% of sectors or more and about 95% of sectors or less are associated with single program and erase entity decoding scheme.

Figure 39:
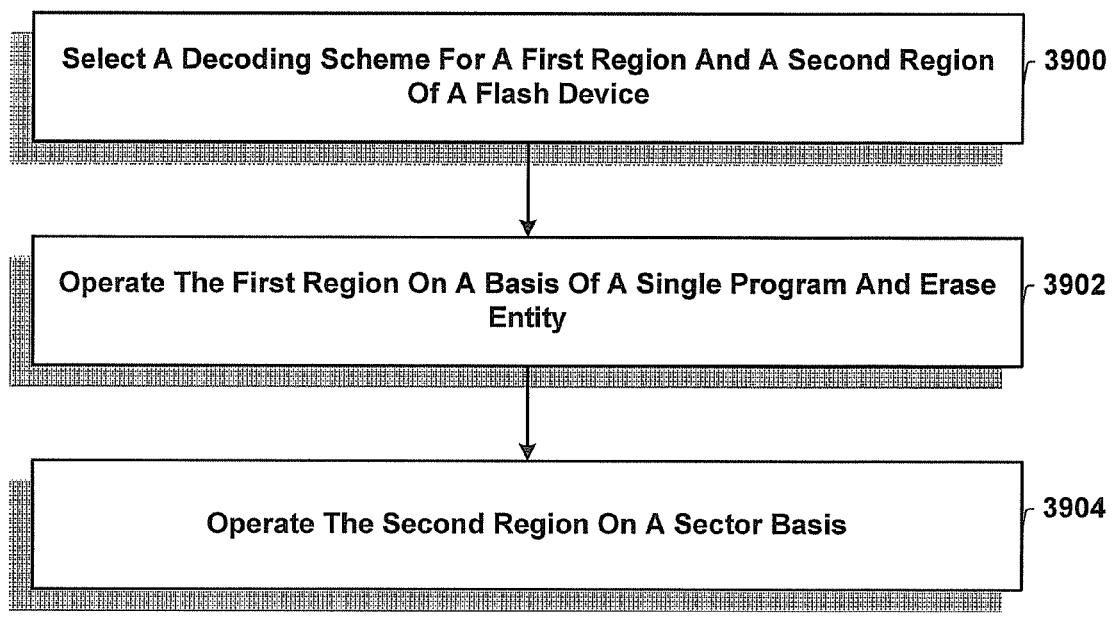
FIG. 39 is a flow diagram of an exemplary methodology for operating a flash memory containing multiple virtual ground decoding schemes in accordance with one aspect of the specification.

FIG. 39 is a flow diagram of an exemplary methodology for operating a flash memory device containing multiple virtual ground decoding schemes. At 3900, a decoding scheme is selected for a first region and a second region of the flash memory device. The first region and the second region can be selected by one or more sector configure registers. A single program and erase entity decoding scheme can be selected for the first region and a dual bit decoding scheme can be selected for the second region. At 3902, the first region is operated on a basis of a single program and erase entity. In the single program and erase entity decoding scheme, the first region of the flash device can be programmed and erased on the basis of the single program and erase entity. At 3904, the second region can be operated in a conventional dual bit decoding scheme. The second region can be programmed and/or erased on a sector basis.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

INDUSTRIAL APPLICABILITY

The systems, structures, and methods described herein are useful in the field of flash device manufacturing and useful in operating flash devices.

What is claimed is:

1. A method of operating a flash device (100), comprising;
   indicating an first erase direction of a low voltage state or a high voltage state;
   erasing a portion of or an entire of the flash device by changing a voltage state of a single program and erase entity (402) in the first erase direction, the single program and erase entity comprising two adjacent dual bit physical memory cells (404, 406) of the flash device as a single logical cell; and
   programming the portion of or the entire of the flash device by changing the voltage state of the single program and erase entity in a second direction opposite to the first erase direction.

2. The method of claim 1, wherein indicating the first erase direction of the low voltage state or the high voltage state comprises:
   programming a indicator cell to the low voltage state or the high voltage state.

3. The method of claim 1, wherein erasing the flash device comprises:
   applying a hot-hole-injection voltage to the single program and erase entity when the low voltage state is indicated as the first erase direction; or
   applying a hot-electron-injection voltage to the single program and erase entity when the high voltage state is indicated as the first erase direction.

4. The method of claim 1, wherein programming the flash device comprises:
   applying a hot election injection voltage to the single program and erase entity when the low voltage state is indicated as the first erase direction; or
   applying a hot-hole-injection voltage to the single program and erase entity when the high voltage state is indicated as the first erase direction.

5. The method of claim 1 further comprising:
indicating a second erase direction of a low voltage state or a high voltage state, the second erase direction being opposite to the first erase direction;
erasing the portion of or the entire of the flash device by changing the voltage state of the single program and erase entity in the second erase direction; and
programming the portion of or the entire of the flash device by changing a voltage state of the single program and erase entity in a direction opposite to the second erase direction.

6. The method of claim 1 further comprising:
reading the flash device by comparing the voltage state of the single program and erase entity with the first erase direction.

7. The method of claim 1, wherein the portion of or the entire of the flash device is erased with the proviso that a sector erase is not performed in the portion of or the entire of the flash device.

8. The method of claim 1, wherein the portion of or the entire of the flash device is erased with the proviso that an erase pulse is not sequentially applied to two or more consecutive bitlines in the portion of or the entire of the flash device.

9. A method of operating a flash device (100), comprising;
programming a portion of or an entire of the flash device on a basis of a single program and erase entity (402) to a voltage state that is different from a first voltage state of an erase direction indicator cell, the single program and erase entity comprising two adjacent dual bit memory cells (404, 406) of the flash device;
changing the first voltage state of the erase direction indicator cell to a second voltage state; and
erasing the portion of or the entire of the flash device on the basis of the single program and erase entity to a voltage state that is the same as the second voltage state of the erase direction indicator cell.

10. The method of claim 9, wherein erasing the portion of or the entire of the flash device on the basis of the single program and erase entity comprising:
neutralizing a charge in the single program and erase entity when the erase direction indicator cell indicates a low voltage state; or
trapping a charge in the single program and erase entity when the erase direction indicator cell indicates a high voltage state as an erase state.

11. The method of claim 10, wherein neutralizing the charge in the single program and erase entity comprises:
applying a hot-hole-injection gate voltage to a gate, applying a hot-hole-injection bitline voltage to a common bitline of the single program and erase entity that is shared by the two adjacent dual bit physical memory cells, and allowing non-common bitlines of the single program and erase entity that are not shared by the two adjacent dual bit physical memory cells to float.

12. The method of claim 10, wherein trapping the charge in the single program and erase entity comprises:
applying a hot-electron-injection gate voltage to a gate, applying a hot-electron-injection bitline voltage to a common bitline of the single program and erase entity that is shared by the two adjacent dual bit physical memory cells, and connecting at least one of non-common bitlines of the single program and erase entity that are not shared by the two adjacent dual bit physical memory cells to ground.

13. The method of claim 11, wherein the hot-hole-injection bitline voltage is applied to the common bitline with the proviso that a sector erase is not performed in the portion of or the entire of the flash device.

14. The method of claim 9 further comprising:
programming the portion of or the entire of the flash device on the basis of the single program and erase entity to a voltage state that is different from the second voltage state of the erase direction indicator cell.

15. A flash device (3100), comprising;
a plurality of single program and erase entities (3102) comprising two adjacent dual bit physical memory cells of the flash device;
an indicator cell (3104) that indicate a first erase direction of a low voltage state or a high voltage state; and
one or more decoders (3108, 3110) that select one or more single program and erase entities for operating the flash device on a basis of the single program and erase entity by changing a voltage state of the single program and erase entity to a low voltage state or a high voltage state.

16. The flash device of claim 15, wherein the indicator cell comprises a single program and erase entity.

17. The flash device of claim 15, wherein the decoders select one or more single program and erase entities for erasing the flash device by applying a hot-hole-injection voltage to the single program and erase entity when the low voltage state is indicated as the first erase direction or by applying a hot-electron-injection voltage to the single program and erase entity when the high voltage state is indicated as the first erase direction.

18. The flash device of claim 15, wherein the decoders select one or more single program and erase entities for programming the flash device by applying a hot election injection voltage to the single program and erase entity when the low voltage state is indicated as the first erase direction or by applying a hot-hole-injection voltage to the single program and erase entity when the high voltage state is indicated as the first erase direction.

19. The flash device of claim 15, wherein after the indicator cell indicates the first erase direction and erasing, programming, reading the flash device, or combinations thereof are performed with the first erase direction, the indicator cell indicates a second erase direction that is opposite to the first erase direction and erasing, programming, reading the flash device, or combinations thereof are performed with the second erase direction.

20. The flash device of claim 15, wherein the memory cells comprise four or more data states.

* * * * *